(12) United States Patent
You et al.

(10) Patent No.: US 12,185,599 B2
(45) Date of Patent: Dec. 31, 2024

(54) DISPLAY APPARATUS AND METHOD OF MANUFACTURING THE SAME

(71) Applicant: SAMSUNG DISPLAY CO., LTD., Yongin-si (KR)

(72) Inventors: Chungi You, Yongin-si (KR); Hyounghak Kim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 18/454,420

(22) Filed: Aug. 23, 2023

(65) Prior Publication Data
US 2023/0403892 A1 Dec. 14, 2023

Related U.S. Application Data

(62) Division of application No. 17/242,522, filed on Apr. 28, 2021, now Pat. No. 11,770,952.

(30) Foreign Application Priority Data

Jul. 1, 2020 (KR) .................. 10-2020-0081067

(51) Int. Cl.
*H10K 59/126* (2023.01)
*H10K 50/844* (2023.01)
(Continued)

(52) U.S. Cl.
CPC ......... *H10K 59/126* (2023.02); *H10K 50/844* (2023.02); *H10K 59/353* (2023.02);
(Continued)

(58) Field of Classification Search
CPC ............ H01L 27/3272; H01L 27/3234; H10K 59/126; H10K 59/34; H10K 59/35–353; H10K 59/65
See application file for complete search history.

(56) References Cited

U.S. PATENT DOCUMENTS

| 8,068,674 B2 | 11/2011 | Goncalves |
| 9,761,651 B2 | 9/2017 | Chang et al. |

(Continued)

FOREIGN PATENT DOCUMENTS

| CN | 103904086 | 7/2014 |
| CN | 109285858 | 1/2019 |

(Continued)

OTHER PUBLICATIONS

Ex Parte Quayle Office Action dated Mar. 2, 2023 in corresponding U.S. Appl. No. 17/242,522.

(Continued)

*Primary Examiner* — Victoria K. Hall
(74) *Attorney, Agent, or Firm* — F. Chau & Associates, LLC

(57) ABSTRACT

A display apparatus includes a substrate including a main display area, a component area, and a peripheral area. The component area includes a transmission area, and the peripheral area is arranged outside the main display area. The display apparatus further includes a main thin-film transistor arranged in the main display area, a main organic light-emitting diode arranged in the main display area and connected to the main thin-film transistor, an auxiliary thin-film transistor arranged in the component area, an auxiliary organic light-emitting diode arranged in the component area and connected to the auxiliary thin-film transistor, and a lower metal layer arranged between the substrate and the auxiliary thin-film transistor in the component area and having an undercut structure.

17 Claims, 19 Drawing Sheets

(51) Int. Cl.
  *H10K 59/35*    (2023.01)
  *H10K 59/65*    (2023.01)
  *H10K 71/00*    (2023.01)
  *H10K 59/123*   (2023.01)
  *H10K 59/124*   (2023.01)
  *H10K 102/10*   (2023.01)

(52) U.S. Cl.
  CPC ............. *H10K 59/65* (2023.02); *H10K 71/00* (2023.02); *H10K 59/123* (2023.02); *H10K 59/124* (2023.02); *H10K 2102/102* (2023.02); *H10K 2102/103* (2023.02)

(56) References Cited

U.S. PATENT DOCUMENTS

| | | | |
|---|---|---|---|
| 9,853,067 B2 | 12/2017 | Cai et al. | |
| 11,515,375 B2 | 11/2022 | Zhang | |
| 11,770,952 B2 * | 9/2023 | You | H10K 50/844 |
| 2015/0380675 A1 | 12/2015 | Kim et al. | |
| 2020/0105844 A1 | 4/2020 | Wang et al. | |
| 2021/0028262 A1 | 1/2021 | Tanaka | |
| 2021/0191552 A1 | 6/2021 | Bok et al. | |
| 2021/0208633 A1 | 7/2021 | Ma et al. | |
| 2021/0257594 A1 | 8/2021 | Kim et al. | |
| 2021/0313410 A1 | 10/2021 | Kim et al. | |
| 2021/0376279 A1 * | 12/2021 | Jeon | H10K 59/131 |
| 2021/0408194 A1 | 12/2021 | Zhang | |
| 2022/0005900 A1 | 1/2022 | You et al. | |
| 2022/0020835 A1 | 1/2022 | Choi et al. | |

FOREIGN PATENT DOCUMENTS

| | | |
|---|---|---|
| CN | 109300957 | 2/2019 |
| CN | 110212005 | 9/2019 |
| CN | 110277423 | 9/2019 |
| CN | 110660835 | 1/2020 |
| KR | 10-2016-0117728 | 10/2016 |

OTHER PUBLICATIONS

Machine translation, Xie, Chinese Pat. Pub. No. CN-110212005-A, translation date: Oct. 18, 2022, Espacenet, all pages. (Year: 2022).

Machine translation, Cai, Chinese Pat. Pub. No. CN-110660835-A, translation date: Oct. 18, 2022, Espacenet, all pages. (Year: 2022).

Machine translation, Nui, Chinese Pat. Pub. No. CN-110277423-A, translation date: Oct. 18, 2022, Espacenet, all pages. (Year: 2022).

Machine translation, Xiao, Chinese Pat. Pub. No. CN-109285858-A, translation date: Oct. 18, 2022, Espacenet, all pages. (Year: 2022).

* cited by examiner

DISPLAY APPARATUS AND METHOD OF MANUFACTURING THE SAME

CROSS-REFERENCE TO RELATED APPLICATION

This application is a divisional application of U.S. patent application Ser. No. 17/242,522 filed Apr. 28, 2021, now U.S. Pat. No. 11,770,952, issued Sep. 26, 2023, which claims priority under 35 U.S.C. § 119 to Korean Patent Application No. 10-2020-0081067, filed on Jul. 1, 2020 in the Korean Intellectual Property Office, the disclosure of which is incorporated by reference herein in its entirety.

TECHNICAL FIELD

Exemplary embodiments of the present disclosure relate to a display apparatus and a method of manufacturing the same, and more particularly, to a display apparatus having improved reliability and a method of manufacturing the same.

DISCUSSION OF RELATED ART

Recently, the usage of display apparatuses has diversified. Also, display apparatuses have become thinner and lighter, and thus, the uses of display apparatuses have expanded.

As display apparatuses are used for various purposes, there are various methods of designing the shapes of the display apparatuses, and the number of functions associated with display apparatuses has increased.

SUMMARY

Exemplary embodiments of the present disclosure include a display apparatus in which a display area is enlarged so that an image is displayed in an area in which components, which are electronic elements, are arranged, as well as a method of manufacturing such a display apparatus.

According to an exemplary embodiment of the present disclosure, a display apparatus includes a substrate including a main display area, a component area, and a peripheral area. The component area includes a transmission area, and the peripheral area is arranged outside the main display area. The display apparatus further includes a main thin-film transistor arranged in the main display area, a main organic light-emitting diode arranged in the main display area and connected to the main thin-film transistor, an auxiliary thin-film transistor arranged in the component area, an auxiliary organic light-emitting diode arranged in the component area and connected to the auxiliary thin-film transistor, and a lower metal layer arranged between the substrate and the auxiliary thin-film transistor in the component area and having an undercut structure.

In an exemplary embodiment, the lower metal layer includes a first metal layer having a first thickness in a thickness direction of the display apparatus, and a second metal layer having a second thickness in the thickness direction of the display apparatus. The second thickness is greater than the first thickness.

In an exemplary embodiment, the first thickness is about 200 Å to about 400 Å, and the second thickness is about 2,500 Å to about 3,500 Å.

In an exemplary embodiment, the lower metal layer includes a first hole corresponding to the transmission area.

In an exemplary embodiment, the second metal layer has the undercut structure.

In an exemplary embodiment, the first metal layer includes at least one of Ti, Cr, ITO, IZO, ZnO, $In_2O_3$, IGO, and AZO.

In an exemplary embodiment, the second metal layer includes Mo.

In an exemplary embodiment, the lower metal layer is directly arranged on an upper surface of the substrate.

In an exemplary embodiment, the lower metal layer and the auxiliary thin-film transistor at least partially overlap each other.

In an exemplary embodiment, the display apparatus further includes an encapsulation substrate arranged above the substrate.

In an exemplary embodiment, the display apparatus further includes a component arranged below the substrate in the component area.

In an exemplary embodiment, the component includes an imaging device or a sensor.

According to an exemplary embodiment of the present disclosure, a display apparatus includes a substrate including a main display area, a component area, and a peripheral area. The component area includes a transmission area, and the peripheral area is arranged outside the main display area. The display apparatus further includes a main thin-film transistor arranged in the main display area, a main organic light-emitting diode arranged in the main display area and connected to the main thin-film transistor, an auxiliary thin-film transistor arranged in the component area, an auxiliary organic light-emitting diode arranged in the component area and connected to the auxiliary thin-film transistor, a lower metal layer arranged between the substrate and the auxiliary thin-film transistor in the component area, and a metal layer arranged on the lower metal layer and having an undercut structure.

In an exemplary embodiment, the display apparatus further includes an auxiliary storage capacitor arranged in the component area. The auxiliary thin-film transistor includes an auxiliary gate electrode, and the auxiliary storage capacitor includes an auxiliary lower electrode and an auxiliary upper electrode.

In an exemplary embodiment, the metal layer includes a first metal layer and a second metal layer arranged on the first metal layer and having the undercut structure.

In an exemplary embodiment, the metal layer is arranged on a same layer as the auxiliary gate electrode.

In an exemplary embodiment, the metal layer is arranged on a same layer as the auxiliary upper electrode.

According to an exemplary embodiment of the present disclosure, a method of manufacturing a display apparatus includes forming a lower metal layer on an upper surface of a substrate. The substrate includes a main display area, a component area, and a peripheral area. The component area includes a transmission area, and the peripheral area is arranged outside the main display area. The lower metal layer is formed in the component area, and the lower metal layer includes a first metal layer and a second metal layer. The method further includes forming a conductive material layer on the substrate in the main display area and on the lower metal layer in the component area, forming a pixel electrode by removing at least a portion of the conductive material layer and by removing the second metal layer from the transmission area, and forming an organic functional layer, an opposite electrode, and an upper layer on an entirety of the upper surface of the substrate. The organic functional layer, the opposite electrode, and the upper layer cover the pixel electrode and the first metal layer. The method further includes irradiating a lower surface of the substrate that is opposite to the upper surface of the substrate in the transmission area with a laser beam.

In an exemplary embodiment, forming the pixel electrode by removing the at least the portion of the conductive material layer and by removing the second metal layer from the transmission area includes removing the at least the portion of the conductive material layer and the second metal layer from the transmission area through wet-etching.

In an exemplary embodiment, the method further includes forming an undercut structure in the second metal layer through the wet-etching.

In an exemplary embodiment, forming the lower metal layer including the first metal layer and the second metal layer includes forming the first metal layer having a first thickness in a thickness direction of the display apparatus, and forming the second metal layer having a second thickness in the thickness direction of the display apparatus. The second thickness is greater than the first thickness.

In an exemplary embodiment, the first thickness is about 200 Å to about 400 Å, and the second thickness is about 2,500 Å to about 3,500 Å.

In an exemplary embodiment, the first metal layer includes at least one of Ti, Cr, ITO, IZO, ZnO, $In_2O_3$, IGO, and AZO.

In an exemplary embodiment, the second metal layer includes Mo.

In an exemplary embodiment, the lower metal layer is directly formed on the upper surface of the substrate.

In an exemplary embodiment, the first metal layer, the organic functional layer, the opposite electrode, and the upper layer formed on the upper surface of the substrate in the transmission area are removed by irradiating the lower surface of the substrate that is opposite to the upper surface of the substrate in the transmission area with the laser beam.

In an exemplary embodiment, the lower metal layer includes a first hole corresponding to the transmission area.

In an exemplary embodiment, the method further includes forming a main thin-film transistor on the substrate in the main display area and an auxiliary thin-film transistor on the lower metal layer in the component area after forming the lower metal layer on the upper surface of the substrate in the component area and before forming the conductive material layer on the substrate in the main display area and on the lower metal layer in the component area.

In an exemplary embodiment, the lower metal layer and the auxiliary thin-film transistor at least partially overlap each other.

In an exemplary embodiment, a component is further arranged on the lower surface of the substrate in the component area, and the component includes an imaging device or a sensor.

BRIEF DESCRIPTION OF THE DRAWINGS

The above and other aspects and features of the present disclosure will become more apparent by describing in detail exemplary embodiments thereof with reference to the accompanying drawings, in which.

DETAILED DESCRIPTION

Figure 1:
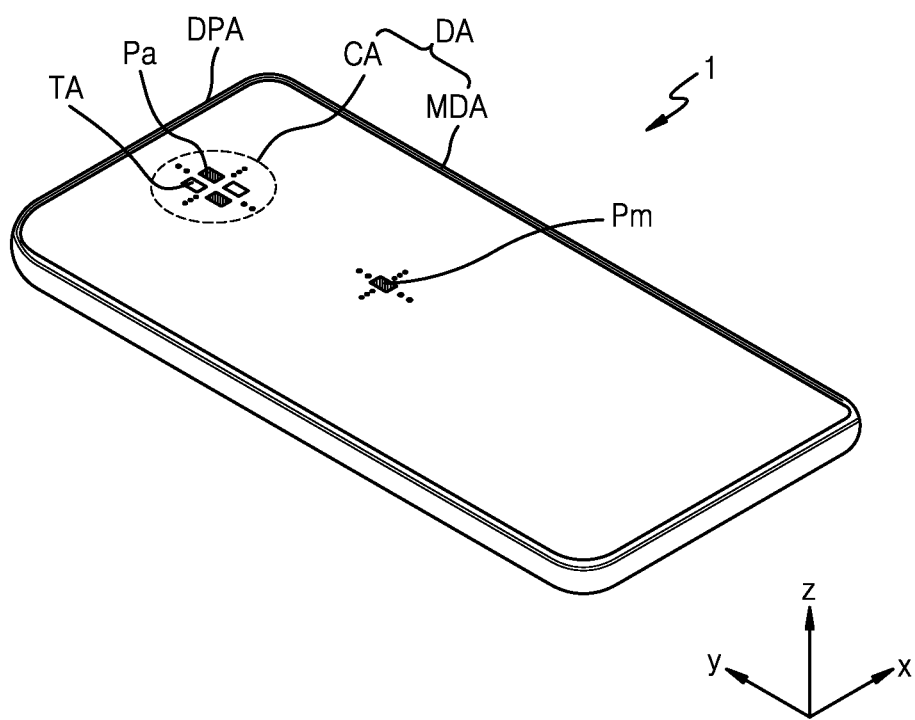
FIG. 1 is a schematic perspective view of a display apparatus according to an exemplary embodiment.

Exemplary embodiments of the present disclosure will be described more fully hereinafter with reference to the accompanying drawings. Like reference numerals may refer to like elements throughout the accompanying drawings.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between components should be interpreted in a like fashion.

In this specification, the expression "A and/or B" may indicate A, B, or A and B. Also, in this specification, the expression "at least one of A and B" may indicate A, B, or A and B.

In exemplary embodiments described hereinafter, "lines extending in a first direction or a second direction" denotes not only the lines extending as a linear shape, but also the lines extending in the first direction or the second direction as a zig-zag shape or a circular shape.

In the exemplary embodiments hereinafter, the expression "planar" indicates a shape when an object is seen downwardly, and the expression "cross-sectional" indicates a shape when an object, which is vertically taken, is seen from the lateral perspective. In the exemplary embodiments below, when a part is referred to as "overlapping," the part may be "planarly" or "cross-sectionally" overlapping.

It should be understood that descriptions of features or aspects within each exemplary embodiment should typically be considered as available for other similar features or aspects in other exemplary embodiments, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

FIG. 1 is a schematic perspective view of a display apparatus 1 according to an exemplary embodiment.

Referring to FIG. 1, the display apparatus 1 may include a display area DA and a peripheral area DPA arranged outside the display area DA. The display area DA may include a component area CA and a main display area MDA at least partially surrounding the component area CA. For example, each of the component area CA and the main display area MDA may display an image separately or may display an image together. The peripheral area DPA may include a non-display area in which display elements are not arranged and an image is not displayed. The display area DA may be entirely surrounded by the peripheral area DPA.

FIG. 1 illustrates that one component area CA is located in the main display area MDA. However, the present disclosure is not limited thereto. For example, according to an exemplary embodiment, the display apparatus 1 may include two or more component areas CA. The two or more component areas CA may have different shapes and sizes from each other. When the component area CA is viewed from the perspective that is substantially perpendicular to an upper surface of the display apparatus 1, the component area CA may have various shapes such as, for example, a polygonal shape including a circular shape, an oval shape, a quadrangular shape, etc., a star shape, a diamond shape, etc. FIG. 1 illustrates that the component area CA is arranged at the upper center side (a +y direction) of the main display area MDA that has a substantially quadrangular shape when viewed from a direction substantially perpendicular to the upper surface of the display apparatus 1.

However, the present disclosure is not limited thereto. For example, according to an exemplary embodiment, the component area CA may be arranged at a side of the main display area MDA that has the quadrangular shape, in which the side include, for example, an upper right side or an upper left side.

The display apparatus 1 may provide an image by using a plurality of main sub-pixels Pm arranged in the main display area MDA and a plurality of auxiliary sub-pixels Pa arranged in the component area CA.

As described below with reference to FIG. 2, a component 40, which is an electronic element, may be arranged below a substrate 100 in the component area CA. The component 40 may correspond to the component area CA. For example, the size of the component area CA may be determined based on the size of the component 40. The component 40 may correspond to a camera using infrared rays or visible rays and may include a capturing device. Alternatively, the component 40 may include, for example, a solar battery, a flash device, an illuminance sensor, a proximity sensor, an iris sensor, etc. Alternatively, the component 40 may have a function to receive sound. However, the component 40 is not limited thereto. The component 40 may be an electronic circuit, and thus, may also be referred to as an electronic circuit component. To prevent the restriction of functions of the component 40 to the extent possible, the component area CA may include a transmission area TA through which light and/or sound may pass through, the light and/or the sound being output from the component 40 to the outside of the display apparatus 1 or progressing toward the component 40 from the outside of the display apparatus 1. In the case of a display apparatus 1 according to an exemplary embodiment, when light is transmitted through the component area CA, a light transmittance may be about 10% or greater, more specifically, about 25% or greater, about 40% or greater, about 50% or greater, about 85% or greater, or about 90% or greater.

The display area including the main display area MDA and the component area CA, which includes the transmission area TA, as well as the peripheral area DPA, may be included on the substrate 100.

The plurality of auxiliary sub-pixels Pa may be arranged in the component area CA. The plurality of auxiliary sub-pixels Pa may emit light to provide a certain image. The image displayed in the component area CA may correspond to an auxiliary image, which may have a lower resolution than an image displayed in the main display area MDA. For example, in a case in which the component area CA includes the transmission area TA through which light and/or sound may be transmitted, and sub-pixels are not arranged in the transmission area TA, the number of auxiliary sub-pixels Pa arranged per unit area in the component area CA may be smaller than the number of main sub-pixels Pm arranged per unit area in the main display area MDA.

Figure 2:
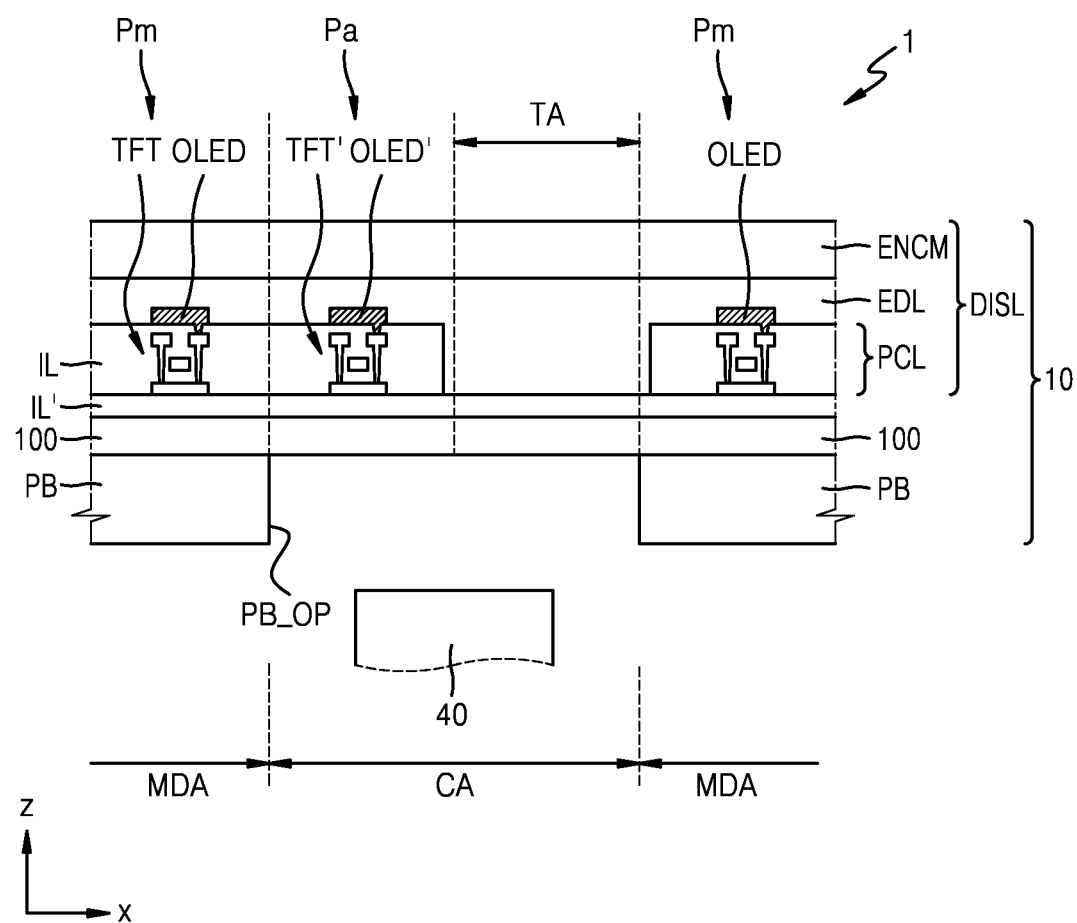
FIG. 2 is a schematic cross-sectional view of a display apparatus according to an exemplary embodiment.

FIG. 2 is a schematic cross-sectional view of the display apparatus 1 according to an exemplary embodiment.

Referring to FIG. 2, the display apparatus 1 may include a display panel 10 and the component 40 overlapping the display panel 10. A cover window protecting the display panel 10 may further be arranged above the display panel 10 in an exemplary embodiment.

The display panel 10 may include the component area CA, which is an area overlapping the component 40, and the main display area MDA in which a main image is displayed. The display panel 10 may include a substrate 100, a display layer DISL arranged above the substrate 100, and a protection member PB arranged below the substrate 100.

The display layer DISL may include a circuit layer PCL including a main thin-film transistor TFT and an auxiliary thin-film transistor TFT', a display element layer EDL including a main organic light-emitting diode OLED and an auxiliary organic light-emitting diode OLED', which are display elements, and an encapsulation member ENCM such as, for example, an encapsulation substrate. A main insulating layer IL and an auxiliary insulating layer IL' may be arranged in the display layer DISL between the substrate 100 and the display layer DISL.

The substrate 100 may include an insulating material such as, for example, glass, quartz, or polymer resins. The substrate 100 may include a rigid substrate or a flexible substrate which may be bent (or bendable), folded (or foldable), or rolled (or rollable).

The main thin-film transistor TFT and the main organic light-emitting diode OLED connected thereto may be arranged in the main display area MDA of the display panel 10 to realize the main sub-pixel Pm. The auxiliary thin-film transistor TFT' and the auxiliary organic light-emitting diode OLED' connected thereto may be arranged in the component area CA of the display panel 10 to realize the auxiliary sub-pixel Pa. An area of the component area CA, in which the auxiliary sub-pixel Pa is arranged, may be referred to as an auxiliary display area.

The component area CA may include the transmission area TA in which a display element is not arranged. The transmission area TA may be an area through which light/a signal emitted from or incident into the component 40 may pass through, the component 40 being arranged to correspond to the component area CA. The auxiliary display area and the transmission area TA may be alternately arranged in the component area CA.

When the display element layer EDL is encapsulated by an encapsulation substrate, the encapsulation substrate may be arranged to face the substrate 100 with the display element layer EDL arranged between the encapsulation substrate and the substrate 100. The encapsulation substrate and the display element layer EDL may have a gap therebetween. The encapsulation substrate may include glass. A sealant including a frit, etc. may be arranged between the substrate 100 and the encapsulation substrate, and the sealant may be arranged in the peripheral area DPA described above. The sealant arranged in the peripheral area DPA may surround the display area DA and prevent the penetration of water or other substances through a side surface of the display area DA.

The display element layer EDL may be covered by the encapsulation substrate or a thin-film encapsulation layer. In exemplary embodiments, the thin-film encapsulation layer may include at least one inorganic encapsulation layer and at least one organic encapsulation layer. For example, the thin-film encapsulation layer may include a first inorganic encapsulation layer, a second inorganic encapsulation layer, and an organic encapsulation layer arranged therebetween.

The protection member PB may be coupled under the substrate 100, and may support and protect the substrate 100. The protection member PB may include an opening PB_OP corresponding to the component area CA. When the protection member PB includes the opening PB_OP, the light transmittance of the component area CA may be improved. The protection member PB may include, for example, polyethyleneterephthalate (PET) or polyimide (PI).

The component area CA may have a greater area than an area in which the component 40 is arranged. Accordingly, in an exemplary embodiment, an area of the opening PB_OP provided in the protection member PB may not correspond to the area of the component area CA.

A plurality of components 40 may be arranged in the component area CA. The plurality of components 40 may have different functions from one another. For example, the plurality of components 40 may include at least two of a camera (an imaging device), a solar battery, a flash device, a proximity sensor, an illuminance sensor, and an iris sensor. However, the plurality of components is not limited thereto.

Figure 3:
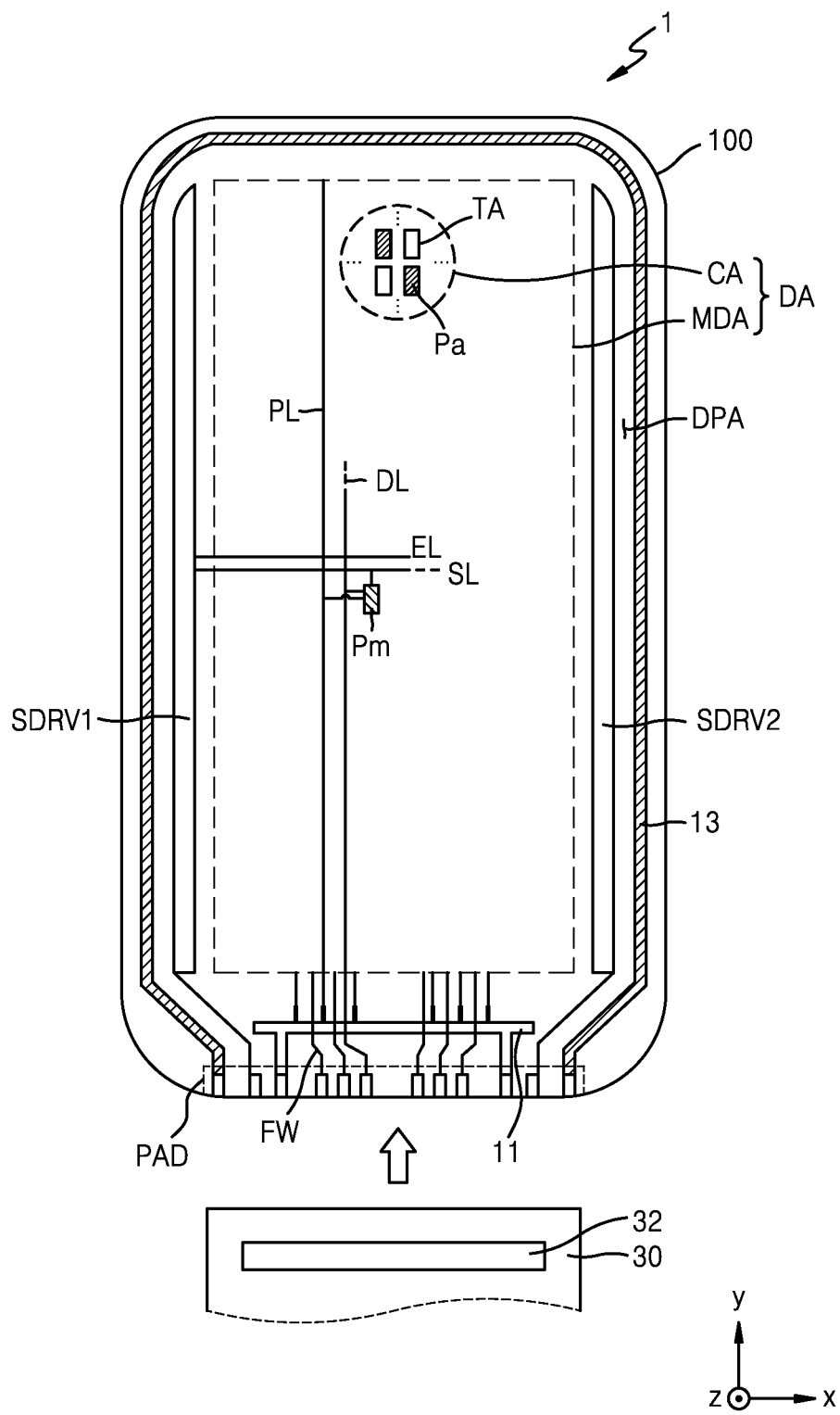
FIG. 3 is a schematic plan view of a display apparatus according to an exemplary embodiment.

FIG. 3 is a schematic plan view of the display apparatus 1 according to an exemplary embodiment.

Referring to FIG. 3, various components included in the display apparatus 1 may be arranged above the substrate 100. The substrate 100 may include the display area DA and the peripheral area PDA surrounding the display area DA. The display area DA may include the main display area MDA in which a main image is displayed and the component area CA in which an auxiliary image is displayed, and in which the component area CA includes the transmission area TA. The auxiliary image may form a general image with the main image, or may be a separate image from the main image.

A plurality of main sub-pixels Pm may be arranged in the main display area MDA. Each of the main sub-pixels Pm may be realized as a display element such as an organic light-emitting diode OLED. Each main sub-pixel Pm may emit, for example, a red, green, blue, or white color of light. The main display area MDA may be covered by an encapsulation member and may be protected from external materials, moisture, etc.

The component area CA may be located at a side of the main display area MDA as described above, or may be arranged in the display area DA and surrounded by the main display area MDA. A plurality of auxiliary sub-pixels Pa may be arranged in the component area CA. Each of the plurality of auxiliary sub-pixels Pa may be realized as a display element such as an organic light-emitting diode OLED. Each auxiliary sub-pixel Pa may emit, for example, a red, green, blue, or white color of light. The component area CA may be covered by an encapsulation member and may be protected from external materials, moisture, etc.

The component area CA may include the transmission area TA. The transmission area TA may surround the plurality of auxiliary sub-pixels Pa. Alternatively, the transmission area TA may form a grid shape with the plurality of auxiliary sub-pixels Pa.

Because the component area CA includes the transmission area TA, a resolution of the component area CA may be lower than a resolution of the main display area MDA. For example, the resolution of the component area CA may be about ½, about ⅜, about ⅓, about ¼, about ⅖, about ⅛, about ⅑, about 1/16, etc. of the resolution of the main display area MDA. For example, the resolution of the main display area may be about 400 PPI or higher, and the resolution of the component area CA may be about 200 PPI or about 100 PPI.

Each of pixel circuits driving the main and auxiliary sub-pixels Pm and Pa may be electrically connected to external circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the pixel circuits driving the main and auxiliary sub-pixels Pm and Pa through a scan line SL. The first scan driving circuit SDRV1 may apply an emission control signal to each pixel circuit through an emission control line EL. The second scan driving circuit SDRV2 may be located on the opposite side to the first scan driving circuit SDRV1 based on the main display area MDA and may be substantially parallel with the first scan driving circuit SDRV1. One or more of the pixel circuits of the main sub-pixels Pm of the main display area MDA may be electrically connected to the first scan driving circuit SDRV1 and the others may be electrically connected to the second scan driving circuit SDRV2. One or more of the pixel circuits of the auxiliary sub-pixels Pa of the component area CA may be electrically connected to the first scan driving circuit SDRV1 and the others may be electrically connected to the second scan driving circuit SDRV2. In an exemplary embodiment, the second scan driving circuit SDRV2 may be omitted.

The terminal portion PAD may be arranged at a side of the substrate 100. In an exemplary embodiment, the terminal portion PAD is not covered by an insulating layer and may be exposed so as to be connected to a display circuit board 30. A display driver 32 may be arranged on the display circuit board 30.

The display driver 32 may generate a control signal to be transmitted to the first scan driving circuit SDRV1 and the second scan driving circuit SDRV2. The display driver 32 may generate a data signal, and the generated data signal may be transmitted to the pixel circuits of the main and auxiliary sub-pixels Pm and Pa through a fan-out wire FW and a data line DL connected to the fan-out wire FW.

The display driver 32 may supply a driving voltage ELVDD to the driving voltage supply line 11 and supply a common voltage ELVSS to the common voltage supply line 13. The driving voltage ELVDD may be applied to the pixel circuits of the main and auxiliary sub-pixels Pm and Pa through a driving voltage line PL connected to the driving voltage supply line 11, and the common voltage ELVSS may be applied to an opposite electrode of the display element by being connected to the common voltage supply line 13.

The driving voltage supply line 11 may be provided under the main display area MDA and may extend in an x direction. The common voltage supply line 13 may have a loop shape having an open side and may partially surround the main display area MDA.

Figure 4:
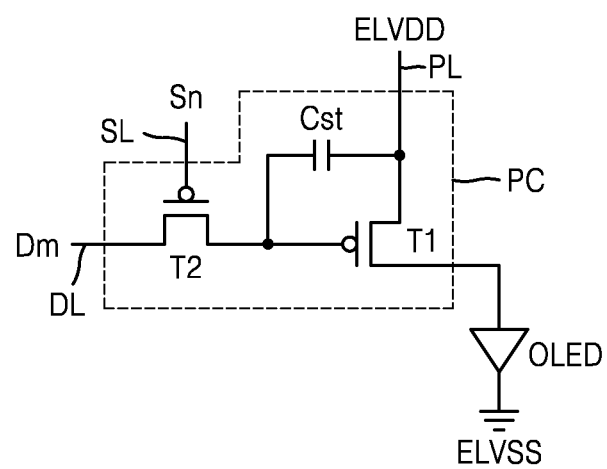
FIGS. 4 and 5 are equivalent circuit diagrams of a pixel which may be included in a display apparatus according to an exemplary embodiment.
Figure 5:
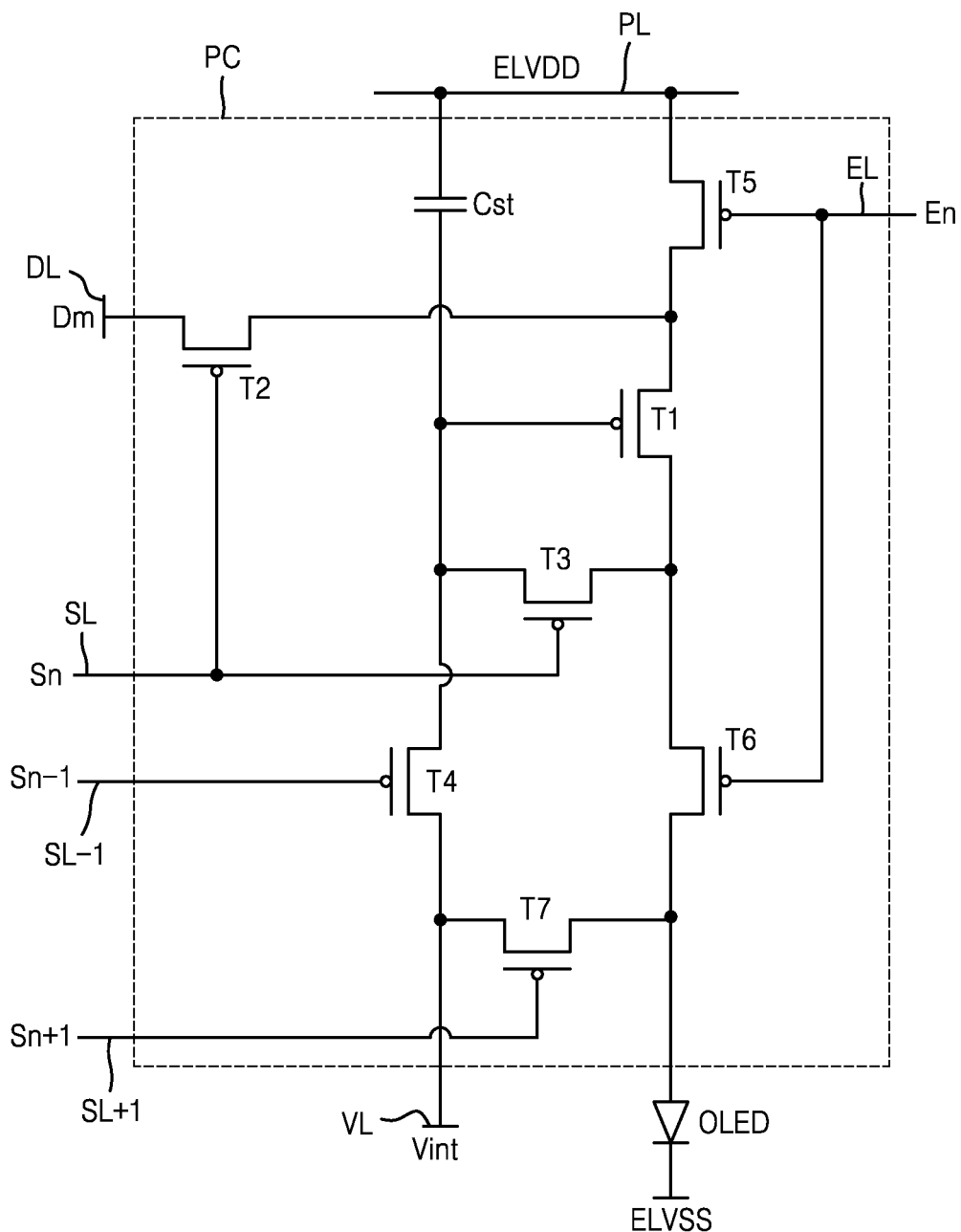

FIGS. 4 and 5 are equivalent circuit diagrams of sub-pixels which may be included in a display apparatus according to an exemplary embodiment.

Referring to FIG. 4, a pixel circuit PC may be connected to the organic light-emitting diode OLED to realize emission of the sub-pixels. The pixel circuit PC may include a driving thin-film transistor T1, a switching thin-film transistor T2, and a storage capacitor Cst. The switching thin-film transistor T2 may be connected to the scan line SL and the data line DL, and may transmit a data signal Dm provided through the data line DL to the driving thin-film transistor T1 in response to a scan signal Sn provided through the scan line SL.

The storage capacitor Cst may be connected to the switching thin-film transistor T2 and the driving voltage line PL, and may store a voltage corresponding to a difference between a voltage received from the switching thin-film transistor T2 and the driving voltage ELVDD supplied to the driving voltage line PL.

The driving thin-film transistor T1 may be connected to the driving voltage line PL and the storage capacitor Cst, and may control a driving current flowing from the driving voltage line PL through the organic light-emitting diode OLED in correspondence with a voltage value stored in the storage capacitor Cst. The organic light-emitting diode OLED may emit light having a certain brightness based on the driving current.

It is described with reference to FIG. 4 that the pixel circuit PC includes two thin-film transistors and one storage capacitor. However, the present disclosure is not limited thereto.

Referring to FIG. 5, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, a second initialization thin-film transistor T7, and the storage capacitor Cst.

FIG. 5 illustrates a case in which each pixel circuit PC includes signal lines SL, SL−1, SL+1, EL, and DL, an initialization voltage line VL, and the driving voltage line PL.

However, the disclosure is not limited thereto. For example, according to an exemplary embodiment, at least one of the signal lines SL, SL−1, SL+1, EL, and DL and/or the initialization voltage line VL may be shared by neighboring pixel circuits.

A drain electrode of the driving thin-film transistor T1 may be electrically connected to the organic light-emitting diode OLED through the emission control thin-film transistor T6. The driving thin-film transistor T1 may receive a data signal Dm according to a switching operation of the switching thin-film transistor T2 and supply a driving current to the organic light-emitting diode OLED.

A gate electrode of the switching thin-film transistor T2 may be connected to the scan line SL, and a source electrode of the switching thin-film transistor T2 may be connected to the data line DL. A drain electrode of the switching thin-film transistor T2 may be connected to a source electrode of the driving thin-film transistor T1 and may be connected to the driving voltage line PL through the operation control thin-film transistor T5.

The switching thin-film transistor T2 may be turned on in response to a scan signal Sn transmitted through the scan line SL and may perform a switching operation of transmitting the data signal Dm transmitted through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1 and may be connected to a pixel electrode of the organic light-emitting diode OLED through the emission control thin-film transistor T6. A drain electrode of the compensation thin-film transistor T3 may be connected to any one electrode of the storage capacitor Cst, a source electrode of the first initialization thin-film transistor T4, and a gate electrode of the driving thin-film transistor T1. The compensation thin-film transistor T3 may be turned on in response to the scan signal Sn transmitted through the scan line SL to connect the gate electrode of the driving thin-film transistor T1 with the drain electrode of the driving thin-film transistor T1, thereby diode-connecting the driving thin-film transistor T1.

A gate electrode of the first initialization thin-film transistor T4 may be connected to a previous scan line SL−1. A drain electrode of the first initialization thin-film transistor T4 may be connected to the initialization voltage line VL. The source electrode of the first initialization thin-film transistor T4 may be connected to any one electrode of the storage capacitor Cst, the drain electrode of the compensation thin-film transistor T3, and the gate electrode of the driving thin-film transistor T1. The first initialization thin-film transistor T4 may be turned on in response to a previous scan signal Sn−1 received through the previous scan line SL−1 and may perform an initialization operation of initializing a voltage of the gate electrode of the driving thin-film transistor T1 by transmitting an initialization voltage Vint to the gate electrode of the driving thin-film transistor Ti.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 may be connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 may be simultaneously turned on in response to an emission control signal En received through the emission control line EL so that the driving voltage ELVDD may be transmitted to the organic light-emitting diode OLED and a driving current may flow in the organic light-emitting diode OLED.

A gate electrode of the second initialization thin-film transistor T7 may be connected to a next scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on in response to a next scan signal Sn+1 received through the next scan line SL+1 and may initialize the pixel electrode of the organic light-emitting diode OLED.

FIG. 5 illustrates a case in which the first initialization thin-film transistor T4 and the second initialization thin-film transistor T7 are respectively connected to the previous scan line SL−1 and the next scan line SL+1. However, the present disclosure is not limited thereto. For example, according to an exemplary embodiment, both the first initialization thin-film transistor T4 and the second initialization thin-film transistor T7 may be connected to the previous scan line SLn−1 and driven according to the previous scan signal Sn−1.

The other electrode of the storage capacitor Cst may be connected to the driving voltage line PL. One electrode of the storage capacitor Cst may be connected to the gate electrode of the driving thin-film transistor T1, the drain electrode of the compensation thin-film transistor T3, and the source electrode of the first initialization thin-film transistor T4.

An opposite electrode (for example, a cathode) of the organic light-emitting diode OLED may receive the common voltage ELVSS. The organic light-emitting diode OLED may emit light by receiving a driving current from the driving thin-film transistor Ti.

The pixel circuit PC is not limited to the number and circuit designs of the thin-film transistors and the storage capacitors described with reference to FIG. 5, and may be variously modified according to exemplary embodiments. The pixel circuits PC for driving the main sub-pixel Pm and the auxiliary sub-pixel Pa may be the same as or different from each other.

Figure 6:
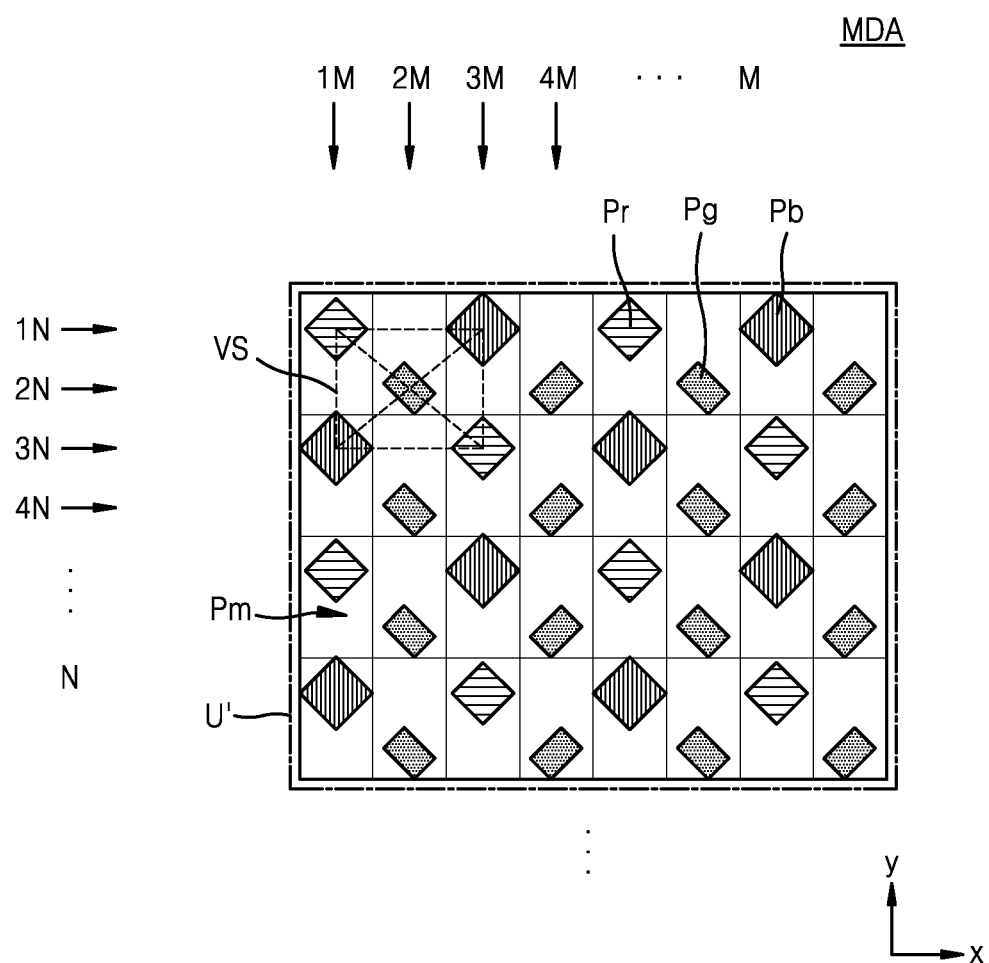
FIG. 6 is a schematic layout of a pixel arrangement structure in a main display area of a display apparatus, according to an exemplary embodiment.

FIG. 6 is a schematic layout of a pixel arrangement structure in the main display area MDA, according to an exemplary embodiment.

The plurality of main sub-pixels Pm may be arranged in the main display area MDA. In this specification, a sub-pixel denotes an emission area of a smallest unit for realizing an image. When an organic light-emitting diode is implemented as a display element, the emission area may be defined by an opening of a pixel-defining layer. This aspect will be described further below.

As illustrated in FIG. 6, the main sub-pixels Pm arranged in the main display area MDA may be arranged in a pentile structure. A red sub-pixel Pr, a green sub-pixel Pg, and a blue sub-pixel Pb may realize a red color, a green color, and a blue color, respectively.

A plurality of red sub-pixels Pr and a plurality of blue sub-pixels Pb may be alternately arranged in a first row 1N, a plurality of green sub-pixels Pg may be arranged in a second row 2N adjacent to the first row 1N to be spaced apart from the plurality of red sub-pixels Pr and the plurality of blue sub-pixels Pb, a plurality of blue sub-pixels Pb and a plurality of red sub-pixels Pr may be alternately arranged in a third row 3N adjacent to the second row 2N, and a plurality of green sub-pixels Pg may be arranged in a fourth row 4N adjacent to the third row 3N to be spaced apart from the plurality of blue sub-pixels Pb and the plurality of red sub-pixels Pr. This arrangement of pixels may be repeated through N rows. Here, the number of blue sub-pixels Pb and red sub-pixels Pr may be greater than the number of green sub-pixels Pg.

The plurality of red sub-pixels Pr and the plurality of blue sub-pixels Pb arranged in the first row 1N may be arranged to be deviated from the plurality of green sub-pixels Pg arranged in the second row 2N. Thus, the plurality of red sub-pixels Pr and the plurality of blue sub-pixels Pb may be alternately arranged in a first column 1M, the plurality of green sub-pixels Pg may be arranged in a second column 2M adjacent to the first column 1M to be spaced apart from the plurality of red sub-pixels Pr and the plurality of blue sub-pixels Pb, the plurality of blue sub-pixels Pb and the plurality of red sub-pixels Pr may be alternately arranged in a third column 3M adjacent to the second column 2M, and the plurality of green sub-pixels Pg may be arranged in a fourth column 4M adjacent to the third column 3M to be spaced apart from the plurality of blue sub-pixels Pb and the plurality of red sub-pixels Pr. This arrangement of pixels may be repeated through M columns.

According to an exemplary embodiment, the red sub-pixels Pr may be arranged at a first vertex and a third vertex of a virtual square VS having a center point of a green sub-pixel Pg as its center point, in which the first and third vertexes face each other, and the blue sub-pixels Pb may be arranged at a second vertex and a fourth vertex, which are the other vertexes of the virtual square VS. Here, the virtual square VS may be variously modified to include a rectangular shape, a diamond shape, a square shape, etc.

This pixel arrangement structure may be referred to as a pentile matrix structure or a pentile structure. A rendering operation for representing a color by sharing adjacent pixels may be applied in this structure to achieve a high resolution by using a small number of pixels.

FIG. 6 illustrates that the plurality of main sub-pixels Pm is arranged in the pentile matrix structure. However, the present disclosure is not limited thereto. For example, according to an exemplary embodiment, the plurality of main sub-pixels Pm may be arranged in various shapes such as, for example, a stripe structure, a mosaic arrangement structure, a delta arrangement structure, etc.

Figure 7:
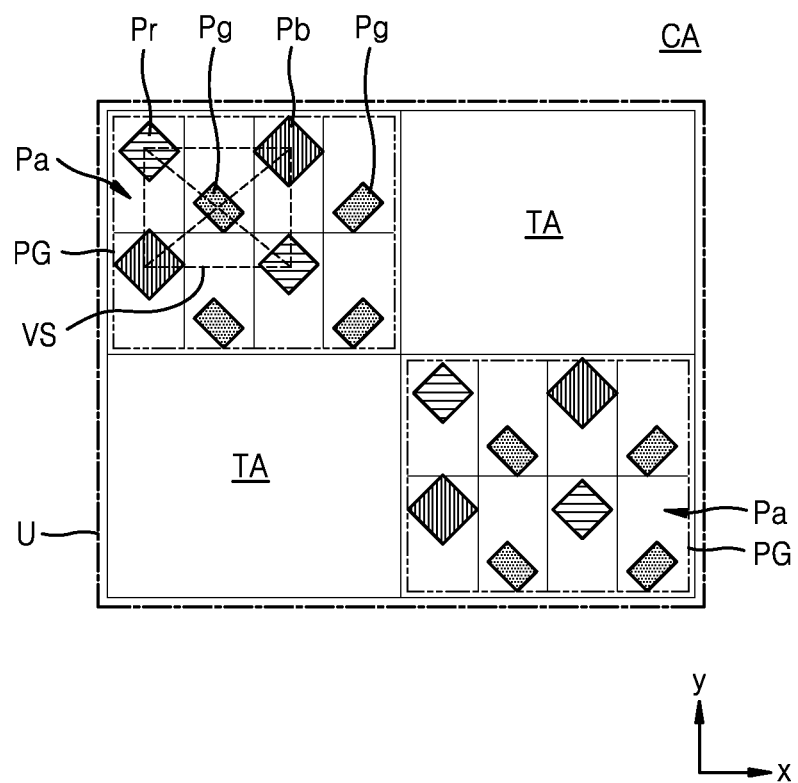
FIGS. 7 and 8 are schematic layouts of a pixel arrangement structure in a component area of a display apparatus, according to exemplary embodiments.
Figure 8:
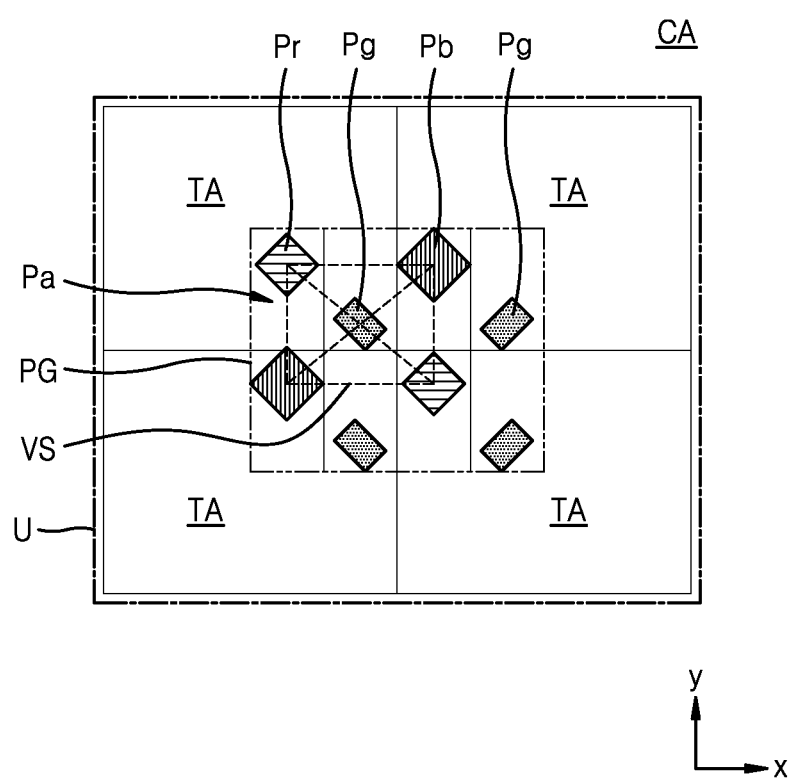

FIGS. 7 and 8 are schematic layouts of a pixel arrangement structure in the component area CA, according to exemplary embodiments.

Referring to FIG. 7, the plurality of auxiliary sub-pixels Pa may be arranged in the component area CA. Each of the plurality of auxiliary sub-pixels Pa may emit any one of red, green, blue, and white colors of light.

The component area CA may have a pixel group PG including at least one auxiliary sub-pixel Pa and the transmission area TA. The pixel group PG and the transmission area TA may be alternately arranged in an x direction and a y direction. For example, the pixel group PG and the transmission area TA may be arranged in a grid shape. In this case, the component area CA may have a plurality of pixel groups PG and a plurality of transmission areas TA.

The pixel group PG may be defined as a set of sub-pixels generated by grouping the plurality of auxiliary sub-pixels Pa in a predetermined unit. For example, as illustrated in FIG. 7, one pixel group PG may include eight auxiliary sub-pixels Pa arranged in a pentile structure. For example, one pixel group PG may include two red sub-pixels Pr, four green sub-pixels Pg, and two blue sub-pixels Pb.

In the component area CA, a basic unit U including a certain number of pixel groups PG and a certain number of transmission areas TA may be repeatedly arranged in the x direction and the y direction. In FIG. 7, the basic unit U may include two pixel groups PG and two transmission areas TA arranged adjacent to the pixel groups PG, in a square shape.

The basic unit U is obtained by dividing repeated shapes, which does not denote that components included in a basic unit U are separate from other components included in another basic unit.

Referring to FIGS. 6 and 7, a corresponding unit U' having the same area as the basic unit U may be set in the main display area MDA. In this case, the number of main sub-pixels Pm included in the corresponding unit U' may be greater than the number of auxiliary sub-pixels Pa included in the basic unit U. For example, the basic unit U may include 16 auxiliary sub-pixels Pa and the corresponding unit U' may include 32 main sub-pixels Pm. Accordingly, the number of auxiliary sub-pixels Pa and the number of main sub-pixels Pm arranged in the same area may have a ratio of 1:2.

As illustrated in FIG. 7, when the auxiliary sub-pixels Pa are arranged in the pentile structure and the resolution of the auxiliary sub-pixels Pa corresponds to ½ of the resolution of the main sub-pixels arranged in the main display area MDA, the pixel arrangement structure may be referred to as a ½ pentile structure. The number and the arrangement structure of auxiliary sub-pixels Pa included in the pixel group PG may be designed to vary according to the resolution of the component area CA.

Referring to FIG. 8, the pixel arrangement structure of the component area CA may correspond to a ¼ pentile structure. According to the an exemplary embodiment, while 8 auxiliary sub-pixels Pa of the pixel group PG may be arranged in the pentile structure, the basic unit U may include only one pixel group PG, and the other areas of the basic unit U may be occupied by the transmission area TA. Thus, the number of auxiliary sub-pixels Pa and the number of main sub-pixels Pm arranged per the same area may have a ratio of 1:4. In this case, one pixel group PG may be surrounded by the transmission area TA.

Figure 9:
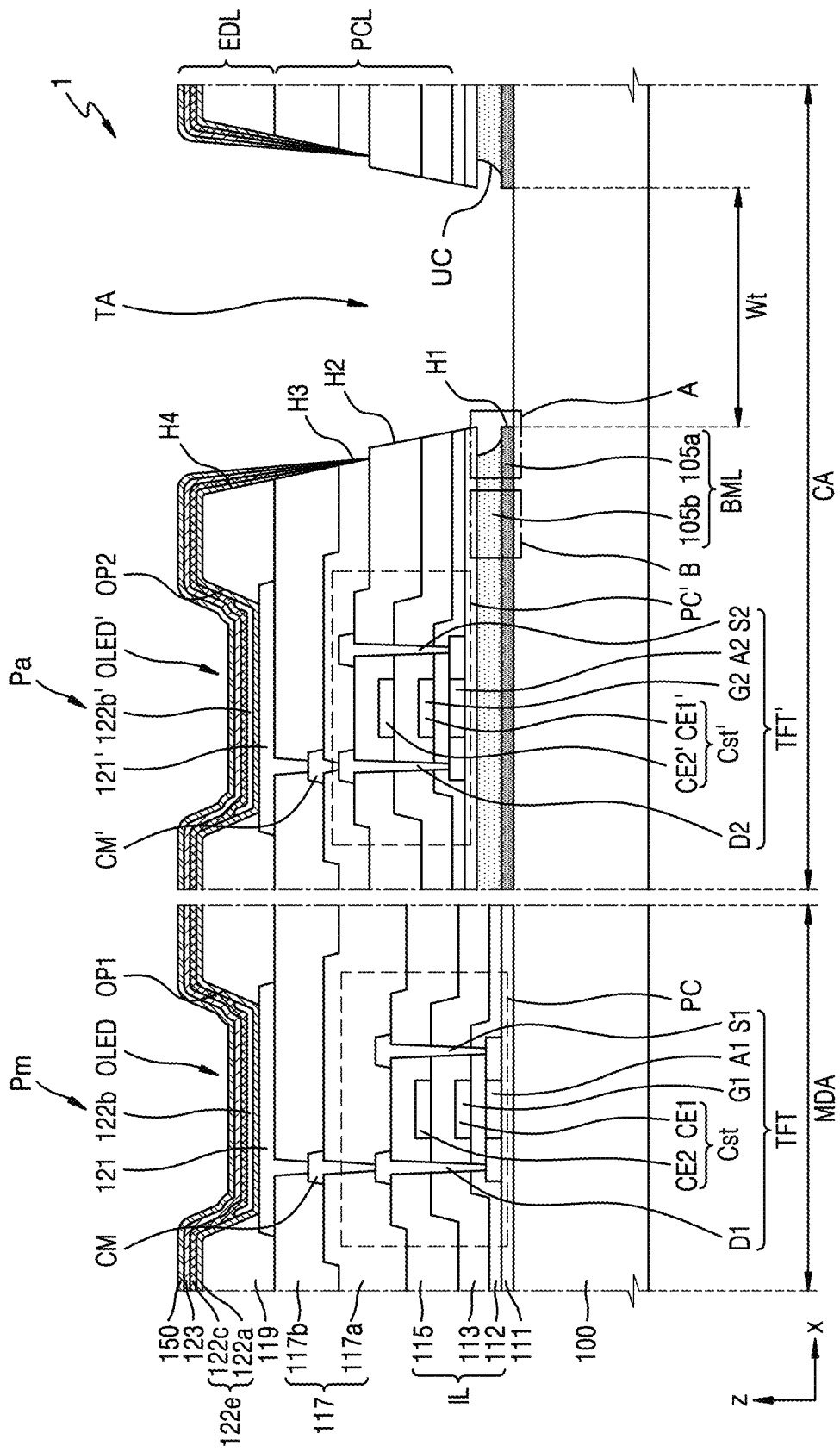
FIG. 9 is a schematic cross-sectional view of a display apparatus according to an exemplary embodiment.
Figure 10:
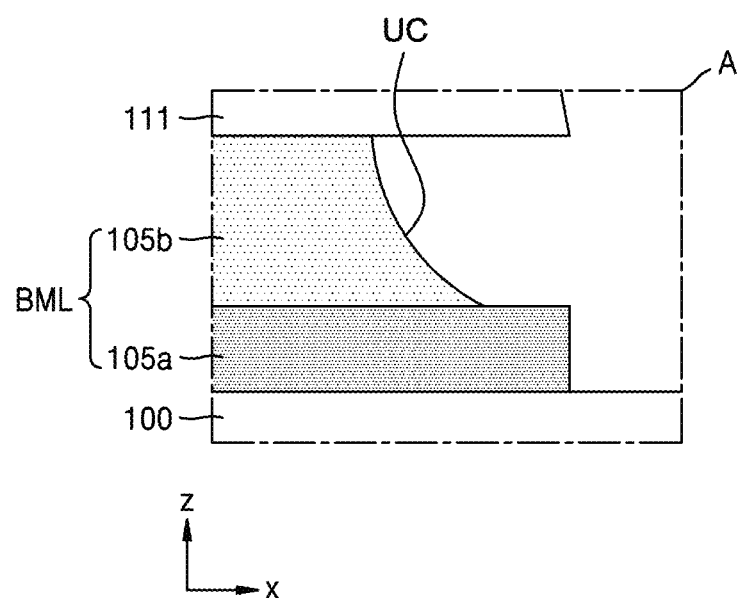
FIGS. 10 and 11 are schematic cross-sectional views of a display apparatus according to an exemplary embodiment.
Figure 11:
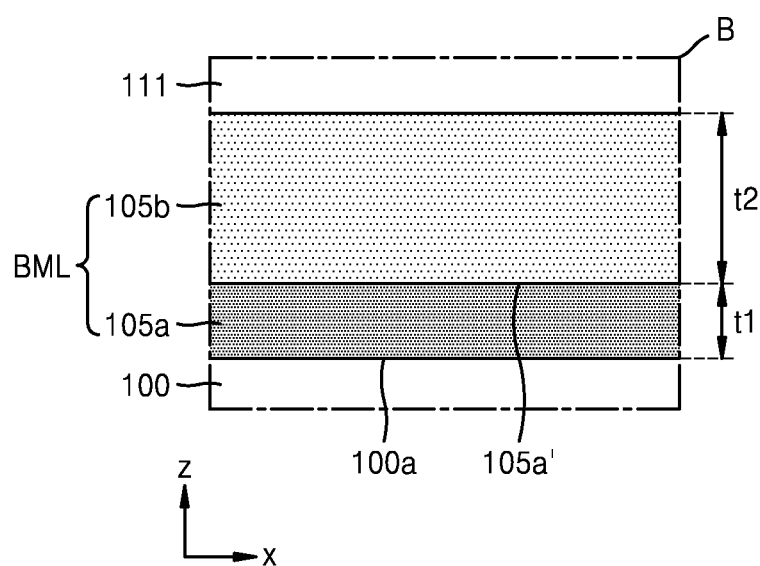

FIG. 9 is a schematic cross-sectional view of the display apparatus 1 according to an exemplary embodiment. FIGS. 10 and 11 are schematic cross-sectional views of the display apparatus 1 according to an exemplary embodiment. FIG. 9 is a schematic cross-sectional view of a portion of the display apparatus 1 according to an exemplary embodiment that schematically illustrates the main display area MDA and the component area CA. FIG. 10 is an enlarged cross-sectional view of region A of FIG. 9, and FIG. 11 is an enlarged cross-sectional view of region B of FIG. 9.

Referring to FIG. 9, the display apparatus 1 may include the main display area MDA and the component area CA. The main sub-pixels Pm may be arranged in the main display area MDA and the auxiliary sub-pixels Pa may be arranged in the component area CA. The component area CA may include the transmission area TA.

A main pixel circuit PC including the main thin-film transistor TFT and the main storage capacitor Cst and the main organic light-emitting diode OLED, which is a display element connected to the main pixel circuit PC, may be arranged in the main display area MDA. An auxiliary pixel circuit PC' including the auxiliary thin-film transistor TFT' and the auxiliary storage capacitor Cst' and the auxiliary organic light-emitting diode OLED', which is a display element connected to the auxiliary pixel circuit PC', may be arranged in the component area CA.

According to an exemplary embodiment, an example in which the organic light-emitting diodes OLED and OLED' are employed as the display elements is described. However, the present disclosure is not limited thereto. For example, according to an exemplary embodiment, an inorganic light-emitting diode or a quantum dot light-emitting diode may be employed as a display element.

Hereinafter, a structure of a stack of the components included in the display apparatus 1 is described. The display apparatus 1 may include the substrate 100, a buffer layer 111, the circuit layer PCL, and the display element layer EDL that are stacked. For example, the buffer layer 111, the circuit layer PCL, and the display element layer EDL may be arranged on an upper surface of the substrate 100.

As described above, the substrate 100 may include an insulating material such as, for example, glass, quartz, and polymer resins. The substrate 100 may include a rigid substrate or a flexible substrate which may be bent (or bendable), folded (or foldable), or rolled (or rollable).

The buffer layer 111 may be arranged on the substrate 100, may reduce or prevent penetration of foreign materials or substances, moisture, etc. from below the substrate 100, and may provide a planarization surface on the substrate 100. The buffer layer 111 may include an inorganic material such as, for example, oxide or nitride, an organic material, or an organic and inorganic compound, and may have a single-layered structure or a multi-layered structure including the inorganic material and the organic material. A barrier layer preventing the penetration of foreign substances may further be included between the substrate 100 and the buffer layer 111. In exemplary embodiments, the buffer layer 111 may include at least one of silicon oxide ($SiO_x$), silicon nitride ($SiN_x$), and silicon oxynitride ($SiO_xN_y$). The buffer layer 111 arranged in the component area CA may have an opening corresponding to the transmission area TA.

In the component area CA, a lower metal layer BML may be arranged between the substrate 100 and the buffer layer 111. The lower metal layer BML may be arranged on the upper surface of the substrate 100 in the component area CA.

Referring to FIGS. 10 and 11, the lower metal layer BML may include a first metal layer 105a and a second metal layer 105b. The second metal layer 105b may be arranged on an upper surface 105a' of the first metal layer 105a. The lower metal layer BML may be arranged above the substrate 100 and below the auxiliary thin-film transistor TFT', and may have an undercut structure UC. For example, the second metal layer 105b of the lower metal layer BML may have the undercut structure UC. The undercut structure UC of the second metal layer 105b may be formed when a material used for forming a pixel electrode is etched together with the second metal layer 105b arranged in the transmission area TA.

Referring to the second metal layer 105b, the undercut structure UC may refer to the shape of the end of the second metal layer 105b facing the transmission area TA. For example, referring to the undercut structure UC, the upper portion of the end of the second metal layer 105b facing the transmission area TA may be disposed further away from the transmission area TA than the lower portion of the end of the second metal layer 105b facing the transmission area TA, and the end of the second metal layer 105b may gradually become closer to the transmission area TA in the x direction as the end extends from the upper portion toward the lower portion in the z direction. For example, referring to the end of the second metal layer 105b facing the transmission area TA, the portion of the end of the second metal layer 105b contacting the buffer layer 111 may be disposed further away from the transmission area TA than the portion of the end of the second metal layer 105b contacting the first metal layer 105a, and the end of the second metal layer 105b may become closer to the transmission area TA in the x direction as the end of the second metal layer 105b becomes closer to the first metal layer 105a in the z direction.

According to an exemplary embodiment, the lower metal layer BML may be directly arranged on an upper surface 100a of the substrate 100. For example, the first metal layer 105a of the lower metal layer BML may be directly arranged on the upper surface 100a of the substrate 100 with no intervening layers or components disposed therebetween. For example, according to an exemplary embodiment, the first metal layer 105a may directly contact the upper surface 100a of the substrate 100. Alternatively, according to an exemplary embodiment, a buffer layer may be arranged between the lower metal layer BML and the substrate 100.

The first metal layer 105a of the lower metal layer BML may have a first thickness t1 extending in a z direction (e.g., a thickness direction of the display apparatus 1). For example, the first metal layer 105a may have a first thickness t1 in a direction extending substantially perpendicular from the upper surface 100a of the substrate 100. According to an exemplary embodiment, the first thickness t1 may be about 100 Å to about 500 Å. According to exemplary embodiments, the first thickness t1 may be about 100 Å to about 400 Å, about 200 Å to about 500 Å, etc. For example, the first thickness t1 may be about 200 Å to about 400 Å in an exemplary embodiment.

The second metal layer 105b of the lower metal layer BML may have a second thickness t2 extending in the z direction (e.g., the thickness direction of the display apparatus 1). For example, the second metal layer 105b may have a second thickness t2 in a direction extending substantially perpendicular from the upper surface 100a of the substrate 100. The second thickness t2 may be greater than the first thickness t1. According to an exemplary embodiment, the second thickness t2 may be about 2000 Å to about 4000 Å. According to an exemplary embodiment, the second thickness t2 may be about 2500 Å to about 4000 Å, about 2000 Å to about 3500 Å, etc. For example, the second thickness t2 may be about 2500 Å to about 3500 Å in an exemplary embodiment.

The lower metal layer BML may include at least one of, for example, Al, Pt, Pd, Ag, Mg, Au, Ni, Nd, Ir, Cr, Ca, Mo, Ti, W, Cu, ITO, IZO, ZnO, $In_2O_3$, IGO, and/or AZO. For example, in an exemplary embodiment, the first metal layer 105a of the lower metal layer BML may include at least one of Ti, Cr, ITO, IZO, ZnO, $In_2O_3$, IGO, and AZO, and the second metal layer 105b may include Mo.

The lower metal layer BML arranged in the component area CA may at least partially overlap the auxiliary pixel circuit PC' arranged in the component area CA. For example, the lower metal layer BML of the component area CA may correspond to the entirety of the component area CA except for a first hole H1 included in the lower metal layer BML in an area corresponding to the transmission area TA. In exemplary embodiments, a shape and a size of the transmission area TA may be defined according to a shape and a size of the first hole H1 defined by the lower metal layer BML. A smallest width Wt of the transmission area TA may be the same as a width of the first hole H1 defined by the lower metal layer BML.

Not arranging the lower metal layer BML in the main display area MDA may result in benefits when manufacturing the display apparatus 1 according to exemplary embodiments of the present disclosure. For example, when the lower metal layer BML is provided on the entire surface or a significant portion of the substrate 100 (e.g., including a portion in the main display area MDA), defects may occur in a process in which a semiconductor layer A1 of a thin-film transistor is crystallized by using a laser beam.

The lower metal layer BML may at least partially overlap the auxiliary thin-film transistor TFT'. The lower metal layer BML may be arranged below the auxiliary thin-film transistor TFT' and may prevent characteristics of the auxiliary thin-film transistor TFT' from being degraded due to light emitted from a component. Also, the lower metal layer BML may prevent light emitted from the component or progressing toward the component from being diffracted through a small gap between wires connected to the auxiliary pixel circuit PC'. In an exemplary embodiment, the lower metal layer BML is not located in the transmission area TA.

The circuit layer PCL may be arranged above the buffer layer 111 and may include the main and auxiliary pixel circuits PC and PC', a first insulating layer 112, a second insulating layer 113, a third insulating layer 115, and a planarization layer 117. The main pixel circuit PC may include the main thin-film transistor TFT and the main storage capacitor Cst, and the auxiliary pixel circuit PC' may include the auxiliary thin-film transistor TFT' and the auxiliary storage capacitor Cst'.

The main thin-film transistor TFT and the auxiliary thin-film transistor TFT' may be arranged above the buffer layer 111. The main thin-film transistor TFT may include a main semiconductor layer A1, a main gate electrode G1, a main source electrode S1, and a main drain electrode D1. The auxiliary thin-film transistor TFT' may include an auxiliary semiconductor layer A2, an auxiliary gate electrode G2, an auxiliary source electrode S2, and an auxiliary drain electrode D2. The main thin-film transistor TFT may be connected to the main organic light-emitting diode OLED and may drive the main organic light-emitting diode OLED. The auxiliary thin-film transistor TFT' may be connected to the auxiliary organic light-emitting diode OLED' and may drive the auxiliary organic light-emitting diode OLED'.

The main semiconductor layer A1 and the auxiliary semiconductor layer A2 may be arranged above the buffer layer 111 and may include polysilicon. According to an exemplary embodiment, the main semiconductor layer A1 and the auxiliary semiconductor layer A2 may include amorphous silicon. According to an exemplary embodiment, the main semiconductor layer A1 and the auxiliary semiconductor layer A2 may include oxide of at least one of, for example, In, Ga, Sn, Zr, V, Hf, Cd, Ge, Cr, Ti, and Zn. The main semiconductor layer A1 and the auxiliary semiconductor layer A2 may include a channel area, and a source area and a drain area doped with impurities.

The auxiliary semiconductor layer A2 may overlap the lower metal layer BML with the buffer layer 111 arranged therebetween. According to an exemplary embodiment, a width of the auxiliary semiconductor layer A2 may be less than a width of the lower metal layer BML, and thus, when viewed from a direction perpendicular to the substrate 100, the auxiliary semiconductor layer A2 may entirely overlap the lower metal layer BML.

The first insulating layer 112 may cover the main semiconductor layer A1 and the auxiliary semiconductor layer A2. The first insulating layer 112 may include an inorganic insulating material such as, for example, $SiO_2$, $SiN_x$, $SiO_xN_y$, $Al_2O_3$, $TiO_2$, $Ta_2O_5$, $HfO_2$, or $ZnO_2$. The first insulating layer 112 may include a single layer or multiple layers including the inorganic insulating materials described above.

The main gate electrode G1 and the auxiliary gate electrode G2 may be arranged on the first insulating layer 112 and may overlap the main semiconductor layer A1 and the auxiliary semiconductor layer A2, respectively. The main gate electrode G1 and the auxiliary gate electrode G2 may include, for example, Mo, Al, Cu, Ti, etc., and may include a single layer or multiple layers.

The second insulating layer 113 may cover the main gate electrode G1 and the auxiliary gate electrode G2. The second insulating layer 113 may include an inorganic insulating material such as, for example, $SiO_2$, $SiN_x$, $SiO_xN_y$, $Al_2O_3$, $TiO_2$, $Ta_2O_5$, $HfO_2$, or $ZnO_2$. The second insulating layer 113 may include a single layer or multiple layers including the inorganic insulating materials described above.

A main upper electrode CE2 of the main storage capacitor Cst and an auxiliary upper electrode CE2' of the auxiliary storage capacitor Cst' may be arranged above the second insulating layer 113.

The main upper electrode CE2 may overlap the main gate electrode G1 arranged therebelow in the main display area MDA. The main gate electrode G1 and the main upper electrode CE2 overlapping each other with the second insulating layer 113 arranged therebetween may be included in the main storage capacitor Cst. The main gate electrode G1 may be integrally provided with a main lower electrode CE1 of the main storage capacitor Cst. According to an exemplary embodiment, the main storage capacitor Cst does not overlap the main thin-film transistor TFT, and the main lower electrode CE1 of the main storage capacitor Cst may be a component separate from the main gate electrode G1 of the main thin-film transistor TFT.

The auxiliary upper electrode CE2' may overlap the auxiliary gate electrode G2 arranged therebelow in the component area CA. The auxiliary gate electrode G2 and the auxiliary upper electrode CE2' overlapping each other with the second insulating layer 113 arranged therebetween may be included in the auxiliary storage capacitor Cst'. The auxiliary gate electrode G2 may be integrally provided with an auxiliary lower electrode CE1 of the auxiliary storage capacitor Cst'. According to an exemplary embodiment, the auxiliary storage capacitor Cst' does not overlap the auxiliary thin-film transistor TFT', and the auxiliary lower electrode CE1' of the auxiliary storage capacitor Cst' may be a component separate from the auxiliary gate electrode G2 of the auxiliary thin-film transistor TFT'.

The main upper electrode CE2 and the auxiliary upper electrode CE2' may include, for example, Al, Pt, Pd, Ag, Mg, Au, Ni, Nd, Ir, Cr, Ca, Mo, Ti, W, and/or Cu, and may include a single layer or multiple layers including the materials described above.

The third insulating layer 115 may cover the main upper electrode CE2 and the auxiliary upper electrode CE2'. The third insulating layer 115 may include, for example, $SiO_2$, $SiN_x$, $SiO_xN_y$, $Al_2O_3$, $TiO_2$, $Ta_2O_5$, $HfO_2$, or $ZnO_2$. The third insulating layer 115 may include a single layer or multiple layers including the inorganic insulating materials described above.

When the first insulating layer 112, the second insulating layer 113, and the third insulating layer 115 are commonly referred to as an inorganic insulating layer IL, the inorganic insulating layer IL may have a second hole H2 corresponding to the transmission area TA. The second hole H2 may expose a portion of the upper surface 100a of the substrate 100. When the buffer layer 111 is arranged in the transmission area TA, the second hole H2 may expose a portion of an upper surface of the buffer layer 111. The second hole H2 may be formed by openings of the first through third insulating layers 112, 113, and 115 overlapping one another, in which the openings of the first through third insulating layers 112, 113, and 115 correspond to the transmission area TA. The openings may be separately formed in separate processes or simultaneously formed in the same process. When the openings are formed in separate processes, an inner surface of the second hole H2 may not be smooth and may have a step difference having a stair shape.

The main source electrode S1 and the auxiliary source electrode S2, and the main drain electrode D1 and the auxiliary drain electrode D2, may be arranged above the third insulating layer 115. The main and auxiliary source electrodes S1 and S2 and the main and auxiliary drain electrodes D1 and D2 may include a conductive material including, for example, Mo, Al, Cu, Ti, etc., and may include multiple layers or a single layer including the materials described above. For example, the main and auxiliary source electrodes S1 and S2 and the main and auxiliary drain electrodes D1 and D2 may include a multi-layered structure of Ti/Al/Ti.

The planarization layer 117 may cover the main and auxiliary source electrodes S1 and S2 and the main and auxiliary drain electrodes D1 and D2. The planarization layer 117 may have a planarized upper surface so that a main pixel electrode 121 and an auxiliary pixel electrode 121' arranged thereabove may be substantially flat.

The planarization layer 117 may include an organic material or an inorganic material and may have a single-layered structure or a multi-layered structure. The planarization layer 117 may include a first planarization layer 117a and a second planarization layer 117b. Accordingly, a conductive pattern such as, for example, wires, etc., may be formed between the first planarization layer 117a and the second planarization layer 117b, resulting in high integration.

The planarization layer 117 may include for example, benzocyclobutene (BCB), PI, hexamethyldisiloxane (HMDSO), polymethylmethacrylate (PMMA), or a general-purpose polymer such as, for example, polystyrene (PS), a polymer derivate having a phenol-based group, an acryl-based polymer, an imide-based polymer, an arylether-based polymer, an amide-based polymer, a fluorine-based polymer, a p-xylene-based polymer, or a vinyl alcohol-based polymer. The planarization layer 117 may include an inorganic insulating material such as, for example, $SiO_2$, $SiN_x$, $SiO_xN_y$, $Al_2O_3$, $TiO_2$, $Ta_2O_5$, $HfO_2$, or $ZnO_2$. When forming the planarization layer 117, chemical mechanical polishing may be performed on an upper surface of a layer that is formed, thereby providing a substantially flat upper surface.

The main and auxiliary organic light-emitting diodes OLED and OLED' may be arranged on the second planarization layer 117b. The main and auxiliary pixel electrodes 121 and 121' of the main and auxiliary organic light-emitting diodes OLED and OLED' may be connected to the main and auxiliary pixel circuits PC and PC' through main and auxiliary connection electrodes CM and CM' arranged on the planarization layer 117.

The main and auxiliary connection electrodes CM and CM' may be arranged between the first planarization layer 117a and the second planarization layer 117b. The main and auxiliary connection electrodes CM and CM' may include a conductive material including, for example, Mo, Al, Cu, Ti, etc., and may include multiple layers or a single layer including the conductive materials described above. For example, the main and auxiliary connection electrodes CM and CM' may include a multi-layered structure of Ti/Al/Ti.

The planarization layer 117 may have a third hole H3 corresponding to the transmission area TA. The third hole H3 may overlap the second hole H2. FIG. 9 illustrates that in an exemplary embodiment, the third hole H3 is greater than the second hole H2. According to an exemplary embodiment, the planarization layer 117 may cover an edge of the second hole H2 of the inorganic insulating layer IL, and thus, an area of the third hole H3 may be less than an area of the second hole H2.

The planarization layer 117 may have a via-hole exposing any one of the main source electrode S1 of the main thin-film transistor TFT and the main drain electrode D1 of the main thin-film transistor TFT, and the main pixel electrode 121 may contact the main source electrode S1 or the main drain electrode D1 through the via-hole to be electrically connected to the main thin-film transistor TFT. Also, the planarization layer 117 may have a via-hole exposing any one of the auxiliary source electrode S2 of the auxiliary thin-film transistor TFT' and the auxiliary drain electrode D2 of the auxiliary thin-film transistor TFT', and the auxiliary pixel electrode 121' may contact the auxiliary source electrode S2 or the auxiliary drain electrode D2 through the via-hole to be electrically connected to the auxiliary thin-film transistor TFT'.

The main pixel electrode 121 may be arranged on the planarization layer 117 in the main display area MDA, and the auxiliary pixel electrode 121' may be arranged on the planarization layer 117 in the component area CA.

The main pixel electrode 121 and the auxiliary pixel electrode 121' may include a conductive oxide such as, for example, indium tin oxide (ITO), indium zinc oxide (IZO), zinc oxide (ZnO), indium oxide ($In_2O_3$), indium gallium oxide (IGO), or aluminum zinc oxide (AZO). The main pixel electrode 121 and the auxiliary pixel electrode 121' may include a reflective layer including, for example, Ag, Mg, Al, Pt, Pd, Au, Ni, Nd, Ir, Cr, or a compound thereof. For example, the main pixel electrode 121 and the auxiliary pixel electrode 121' may have a structure in which layers including ITO, IZO, ZnO, or $In_2O_3$ are arranged above/below the reflective layer described above. In this case, the main pixel electrode 121 and the auxiliary pixel electrode 121' may have a structure of a stack of ITO/Ag/ITO.

A pixel-defining layer 119 may cover an edge of each of the main pixel electrode 121 and the auxiliary pixel electrode 121' above the planarization layer 117, and may include a first opening OP1 and a second opening OP2 exposing at least portions of the main pixel electrode 121 and the auxiliary pixel electrode 121'. According to the first opening OP1 and the second opening OP2, emission areas of the main and auxiliary organic light-emitting diodes OLED and OLED', that is, sizes and shapes of the main and auxiliary sub-pixels Pm and Pa, may be defined.

The pixel-defining layer 119 may increase a distance between edges of the main and auxiliary pixel electrodes 121 and 121' and an opposite electrode 123 on the main and auxiliary pixel electrodes 121 and 121'. As a result, the occurrence of arcs, etc. at the edges of the main and auxiliary pixel electrodes 121 and 121' may be prevented. The pixel-defining layer 119 may be formed by using, for example, a spin coating method, etc., by using an organic insulating material such as, for example, PI, polyamide, acryl resins, BCB, HMDSO, phenol resins, etc.

The pixel-defining layer 119 may have a fourth hole H4 corresponding to the transmission area TA. The fourth hole H4 may overlap the second hole H2 and the third hole H3. The light transmittance of the transmission area TA may be increased due to the presence of the second through fourth holes H2 through H4. A portion of the opposite electrode 123 to be described below may be arranged at inner surfaces of the second through fourth holes H2 through H4.

A main emission layer 122b and an auxiliary emission layer 122b' corresponding to the main pixel electrode 121 and the auxiliary pixel electrode 121' respectively may be arranged in the first opening OP1 and the second opening OP2 of the pixel-defining layer 119. The main emission layer 122b and the auxiliary emission layer 122b' may include a high molecular-weight material or a low molecular-weight material and may emit red, green, blue, or white light.

An organic functional layer 122e may be arranged above and/or below the main emission layer 122b and the auxiliary emission layer 122b'. The organic functional layer 122e may include a first functional layer 122a and/or a second functional layer 122c. The first functional layer 122a or the second functional layer 122c may be omitted according to exemplary embodiments.

The first functional layer 122a may be arranged below the main emission layer 122b and the auxiliary emission layer 122b'. The first functional layer 122a may include a single layer or multiple layers including an organic material. The first functional layer 122a may include a hole transport layer (HTL) having a single-layered structure. Alternatively, the first functional layer 122a may include a hole injection layer (HIL) and an HTL. The first functional layer 122a may integrally correspond to the main and auxiliary organic light-emitting diodes OLED and OLED' included in the main display area MDA and the component area CA.

The second functional layer 122c may be arranged above the main emission layer 122b and the auxiliary emission layer 122b'. The second functional layer 122c may include a single layer or multiple layers including an organic material. The second functional layer 122c may include an electron transport layer (ETL) and/or an electron injection layer (EIL). The second functional layer 122c may integrally correspond to the main and auxiliary organic light-emitting diodes OLED and OLED' included in the main display area MDA and the component area CA.

The opposite electrode 123 may be arranged above the second functional layer 122c. The opposite electrode 123 may include a conductive material having a low work function. For example, the opposite electrode 123 may include a (semi) transparent layer including Ag, Mg, Al, Pt, Pd, Au, Ni, Nd, Ir, Cr, Li, Ca, or an alloy thereof. Alternatively, the opposite electrode 123 may further include a layer such as, for example, ITO, IZO, ZnO, or $In_2O_3$, arranged on the (semi) transparent layer including the materials described above. The opposite electrode 123 may integrally correspond to the main and auxiliary organic light-emitting diodes OLED and OLED' included in the main display area MDA and the component area CA.

Layers formed between the main pixel electrode 121 and the opposite electrode 123 in the main display area MDA may be included in the main organic light-emitting diode OLED. Layers formed between the auxiliary pixel electrode 121' and the opposite electrode 123 in the component area CA may be included in the auxiliary organic light-emitting diode OLED.

An upper layer 150 including an organic material may be formed above the opposite electrode 123. The upper layer 150 may protect the opposite electrode 123 and increase the light extraction efficiency. The upper layer 150 may include an organic material having a higher refractive index than an organic material of the opposite electrode 123. Alternatively, the upper layer 150 may include stacked layers having different refractive indices. For example, the upper layer 150 may be formed by including a high refractive index layer, a low refractive index layer, and a high refractive index layer that are stacked. Here, a refractive index of the high refractive index layer may be about equal to or higher than 1.7 and a refractive index of the low refractive index layer may be about equal to or lower than 1.3. The upper layer 150 may additionally include LiF. Alternatively, the upper layer 150 may additionally include at least one of, for example, $SiO_2$, $SiN_X$, and $SiO_XN_Y$. According to an exemplary embodiment, the upper layer 150 may be omitted.

In an exemplary embodiment, the organic functional layer 122e, the opposite electrode 123, and the upper layer 150 are not arranged in the transmission area TA. For example, materials included in the organic functional layer 122e, the opposite electrode 123, and the upper layer 150 may be formed on the entire surface of the substrate 100, and then, a laser lift-off operation may be used to remove the organic functional layer 122e, the opposite electrode 123, and the upper layer 150 formed in a location corresponding to the transmission area TA. Thus, in an exemplary embodiment, the organic functional layer 122e, the opposite electrode 123, and the upper layer 150 are not arranged in the transmission area TA. Thus, the light transmittance in the transmission area TA may be significantly increased.

Figure 12:
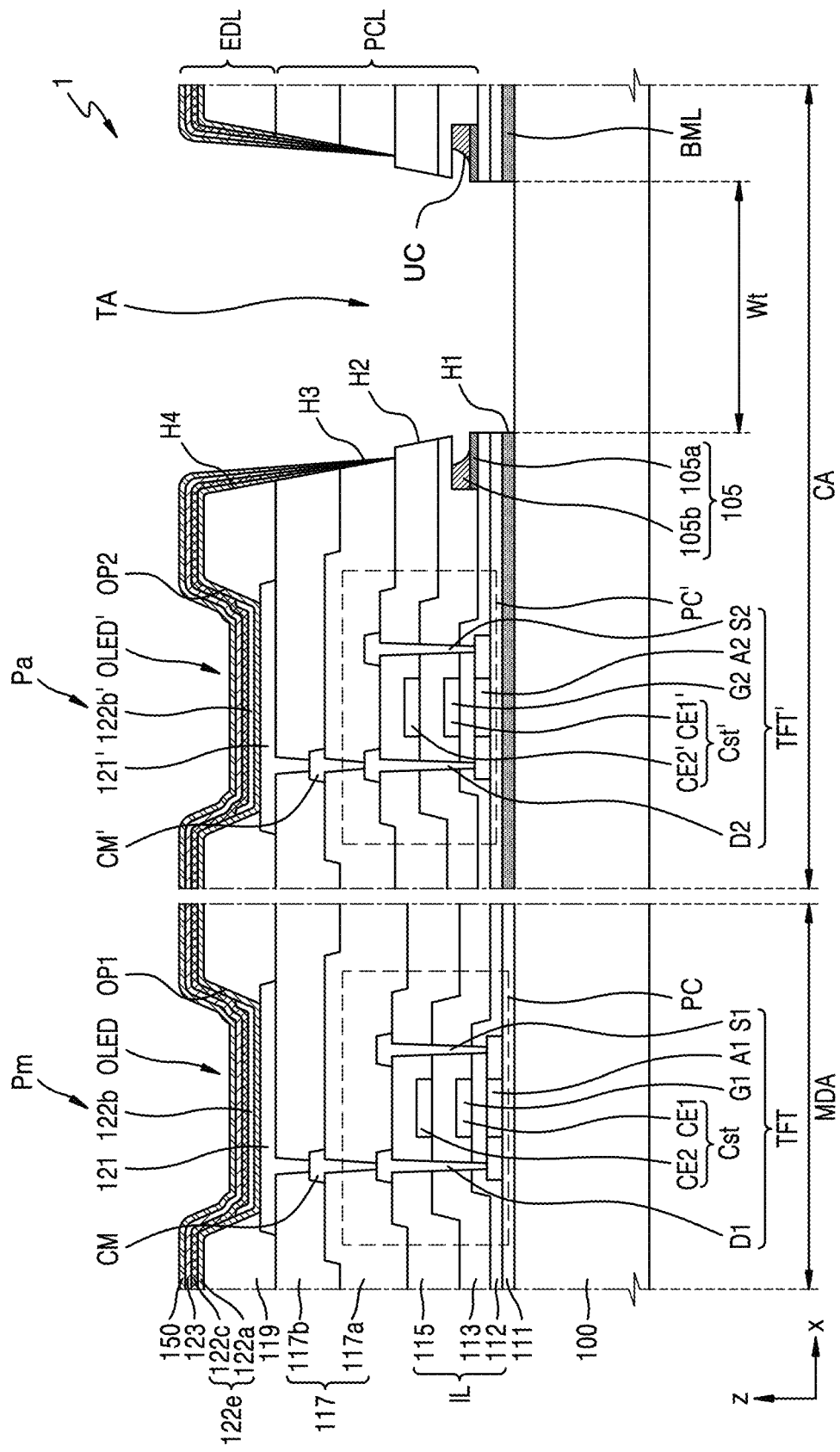
FIG. 12 is a schematic cross-sectional view of a display apparatus according to an exemplary embodiment.

FIG. 12 is a schematic cross-sectional view of the display apparatus 1 according to an exemplary embodiment. The exemplary embodiment of FIG. 12 differs from the exemplary embodiment of FIG. 9 in that in the exemplary embodiment of FIG. 12, the first metal layer 105a and the second metal layer 105b having the undercut structure UC are included in a metal layer 105 arranged above the first insulating layer 112. Hereinafter, for convenience of explanation, differences relative to the exemplary embodiment of FIG. 9 will be mainly described, and to the extent that a further description of elements and technical aspects is omitted, it may be assumed that these elements and technical aspects are at least similar to corresponding elements and technical aspects that have been described elsewhere in the present disclosure.

Referring to FIG. 12, the metal layer 105 including the first metal layer 105a and the second metal layer 105b may be arranged above the lower metal layer BML. The auxiliary pixel circuit PC' may include the auxiliary thin-film transistor TFT' and the auxiliary storage capacitor Cst', the auxiliary thin-film transistor TFT' may include the auxiliary gate electrode G2, and the auxiliary storage capacitor Cst' may include the auxiliary lower electrode CE1' and the auxiliary upper electrode CE2'. In an exemplary embodiment, the metal layer 105 may be arranged adjacent to the auxiliary thin-film transistor TFT' in the x direction, and is not arranged below the auxiliary thin-film transistor TFT' in the z direction.

The metal layer 105 including the first metal layer 105a and the second metal layer 105b may be arranged on the same layer as the auxiliary thin-film transistor TFT' and may have the undercut structure UC. According to an exemplary embodiment, the metal layer 105 may be arranged above the first insulating layer 112. The metal layer 105 may be arranged on the same layer as the auxiliary gate electrode G2 of the auxiliary thin-film transistor TFT'. Although FIG. 12 illustrates an exemplary embodiment in which the metal layer 105 and the auxiliary gate electrode G2 are spaced apart from each other, the present disclosure is not limited thereto. For example, according to an exemplary embodiment, the metal layer 105 and the auxiliary gate electrode G2 may be integrally provided.

As described above, the metal layer 105 may include the first metal layer 105a and the second metal layer 105b. The second metal layer 105b may be arranged above the first metal layer 105a and may have the undercut structure UC. The second metal layer 105b may be thicker than the first metal layer 105a. For example, the first metal layer 105a may have a thickness of about 200 Å to about 400 Å, and the second metal layer 105b may have a thickness of about 2500 Å to about 3500 Å.

The metal layer 105 may include, for example, Al, Pt, Pd, Ag, Mg, Au, Ni, Nd, Ir, Cr, Ca, Mo, Ti, W, Cu, ITO, IZO, ZnO, In₂O₃, IGO, or AZO. For example, the first metal layer 105a of the metal layer 105 may include at least one of Ti, Cr, ITO, IZO, ZnO, In₂O₃, IGO, and AZO, and the second metal layer 105b may include Mo.

Figure 13:
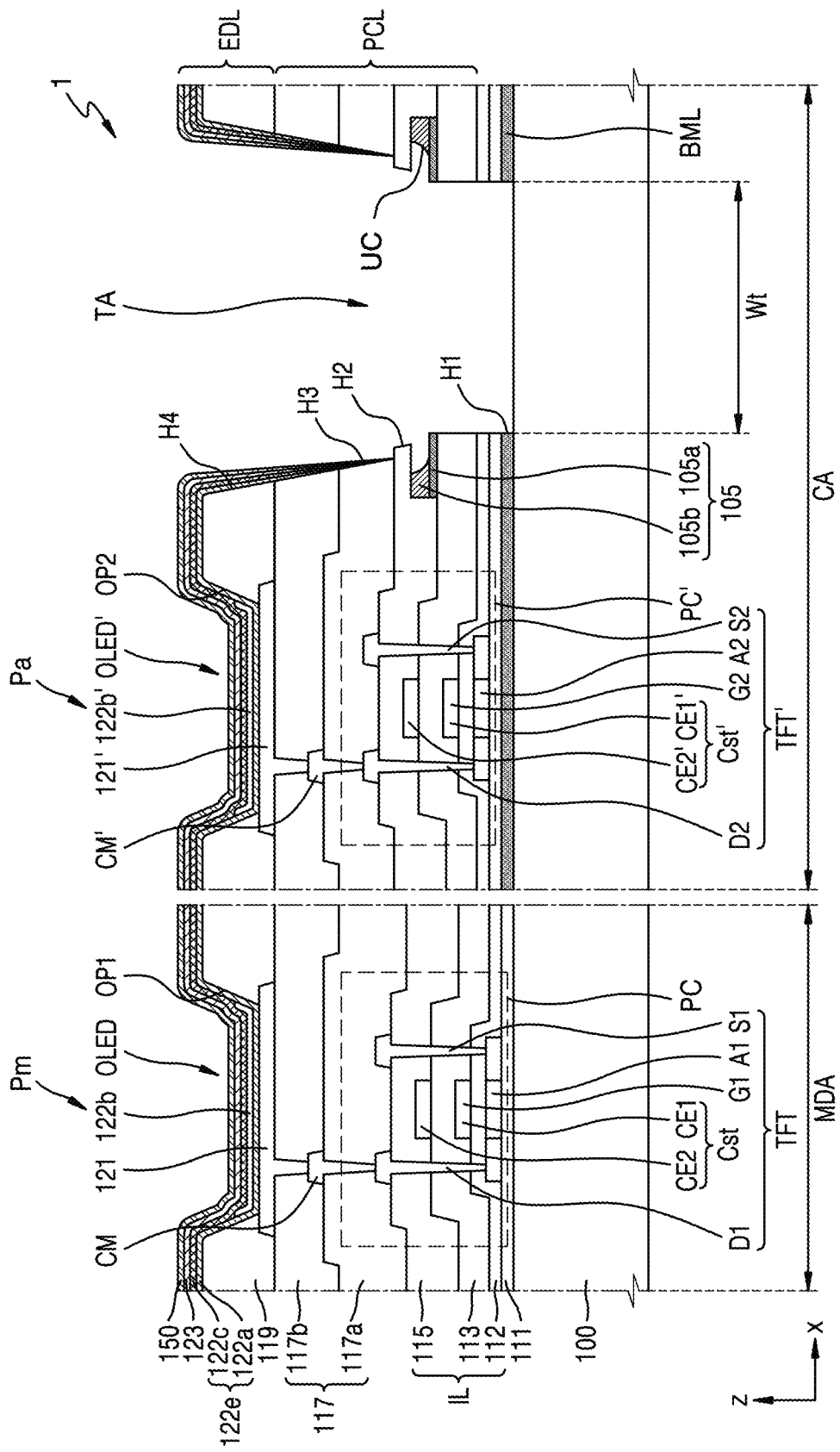
FIG. 13 is a schematic cross-sectional view of a display apparatus according to an exemplary embodiment.

FIG. 13 is a schematic cross-sectional view of the display apparatus 1 according to an exemplary embodiment. The exemplary embodiment of FIG. 13 differs from the exemplary embodiment of FIG. 12 in that in the exemplary embodiment of FIG. 13, the first metal layer 105a and the second metal layer 105b having the undercut structure UC are included in a metal layer 105 arranged above the second insulating layer 113. Hereinafter, for convenience of explanation, differences relative to the exemplary embodiment of FIG. 12 will be mainly described, and to the extent that a further description of elements and technical aspects is omitted, it may be assumed that these elements and technical aspects are at least similar to corresponding elements and technical aspects that have been described elsewhere in the present disclosure.

Referring to FIG. 13, the metal layer 105 including the first metal layer 105a and the second metal layer 105b may be arranged on the same layer as the auxiliary storage capacitor Cst' and may have the undercut structure UC. According to an exemplary embodiment, the metal layer 105 may be arranged above the second insulating layer 113. The metal layer 105 may be arranged on the same layer as the auxiliary upper electrode CE2' of the auxiliary storage capacitor Cst'. Although FIG. 13 illustrates an exemplary embodiment in which the metal layer 105 and the auxiliary upper electrode CE2' are spaced apart from each other, the present disclosure is not limited thereto. For example, according to an exemplary embodiment, the metal layer 105 and the auxiliary upper electrode CE2' may be integrally provided.

As described above, the metal layer 105 may include the first metal layer 105a and the second metal layer 105b. The second metal layer 105b may be arranged above the first metal layer 105a and may have the undercut structure UC. The second metal layer 105b may be thicker than the first metal layer 105a.

FIGS. 14 through 19 are schematic cross-sectional views for describing a method of manufacturing the display apparatus 1, according to an exemplary embodiment. The method described with reference to FIGS. 14 through 19 may correspond to a process in which the display apparatus 1 described with reference to FIGS. 9 through 11 is formed.

Hereinafter, the method of manufacturing the display apparatus 1 is described with reference to FIGS. 14 through 19.

The method of manufacturing the display apparatus 1, according to an exemplary embodiment, may include providing the substrate 100 including the main display area MDA, the component area CA including the transmission area TA, and the peripheral area DPA outside the main display area MDA, forming the lower metal layer BML on an upper surface of the substrate 100 in the component area CA, the lower metal layer BML including the first metal layer 105a and the second metal layer 105b, forming a conductive material layer 121M on an upper surface of the substrate 100 in the main display area MDA and the lower metal layer BML in the component area CA, forming the main and auxiliary pixel electrodes 121 and 121' by removing at least a portion of the conductive material layer 121M, removing the second metal layer 105b corresponding to the transmission area TA, forming the organic functional layer 122e, the opposite electrode 123, and the upper layer 150 on the entire surface of the substrate 100 to cover the main and auxiliary pixel electrodes 121 and 121' and the first metal layer 105a, and irradiating a lower surface of the substrate 100 that is opposite to the upper surface of the substrate 100 in the transmission area TA with a laser beam.

Figure 14:
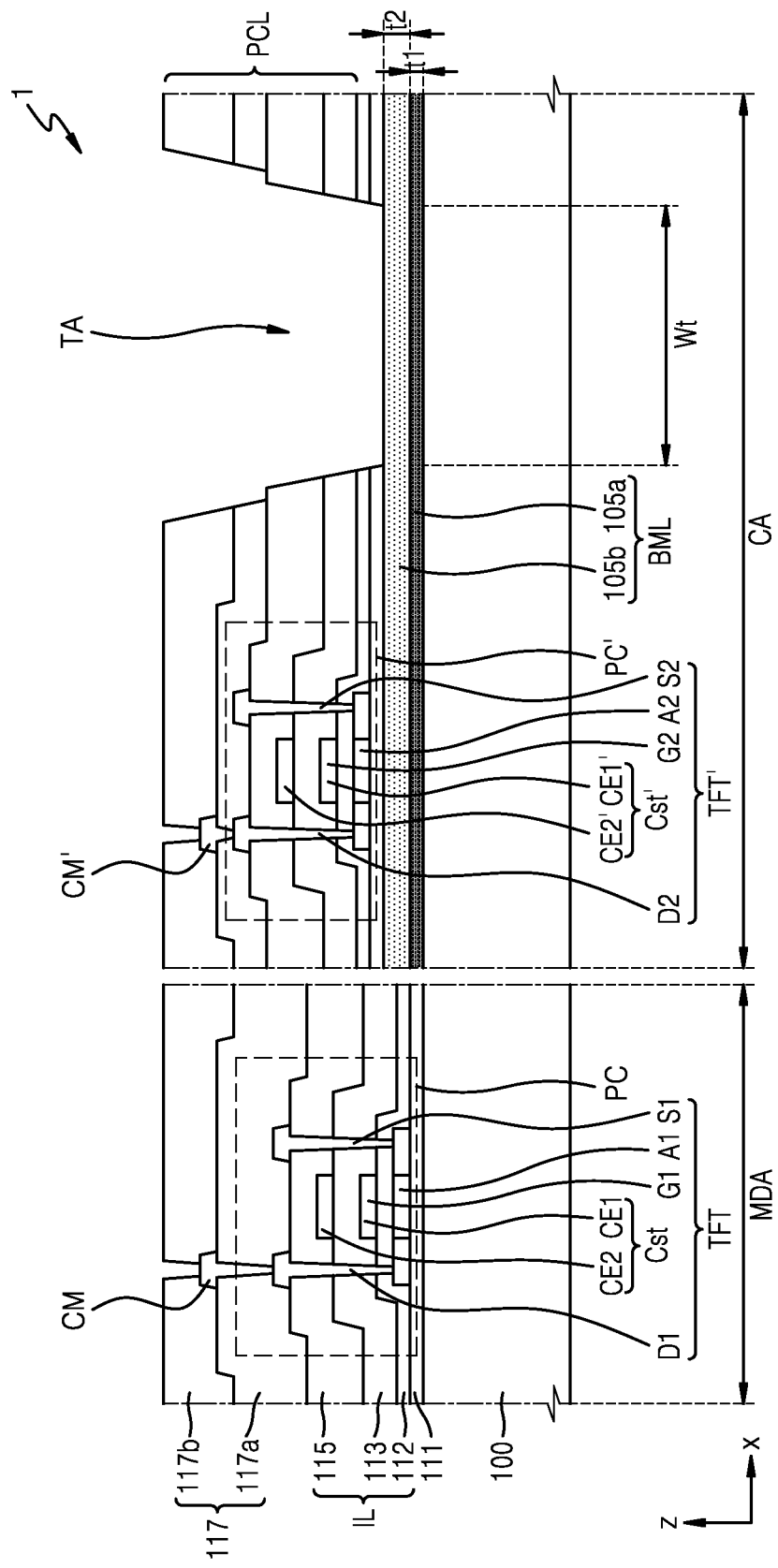
FIGS. 14 through 19 are schematic cross-sectional views for describing a method of manufacturing a display apparatus, according to an exemplary embodiment.

Referring to FIG. 14, providing of the substrate 100 including the main display area MDA, the component area CA including the transmission area TA, and the peripheral area DPA outside the main display area MDA, and forming the lower metal layer BML on the upper surface of the substrate 100 in the component area CA, the lower metal layer BML including the first metal layer 105a and the second metal layer 105b, may be performed.

Forming the lower metal layer BML including the first metal layer 105a and the second metal layer 105b on the upper surface of the substrate 100 in the component area CA may include forming, on the substrate 100, the first metal layer 105a to have the first thickness t1 in the z direction (e.g., the thickness direction of the display apparatus 1), and forming, on the first metal layer 105a, the second metal layer 105b to have the second thickness t2 in the z direction (e.g., the thickness direction of the display apparatus 1). The second thickness t2 of the second metal layer 105b may be greater than the first thickness t1 of the first metal layer 105a. For example, the first thickness t1 may be about 200 Å to about 400 Å, and the second thickness t2 may be about 2500 Å to about 3500 Å.

After the lower metal layer BML including the first metal layer 105a and the second metal layer 105b is formed on the upper surface of the substrate 100 in the component area CA, the main pixel circuit PC may be formed on the upper surface of the substrate 100 in the main display area MDA, and the auxiliary pixel circuit PC' may be formed on the lower metal layer BML in the component area CA.

The main pixel circuit PC may include the main thin-film transistor TFT and the main storage capacitor Cst, and the auxiliary pixel circuit PC' may include the auxiliary thin-film transistor TFT' and the auxiliary storage capacitor Cst'.

The lower metal layer BML and the auxiliary pixel circuit PC' arranged on the component area CA may overlap each other. The lower metal layer BML may be arranged below the auxiliary pixel circuit PC' and may prevent characteristics of the auxiliary thin-film transistor TFT' from being degraded due to the light emitted from a component, etc.

The planarization layer 117 may be formed on the main pixel circuit PC and the auxiliary pixel circuit PC'. The planarization layer 117 may cover the main pixel circuit PC and the auxiliary pixel circuit PC'.

Figure 15:
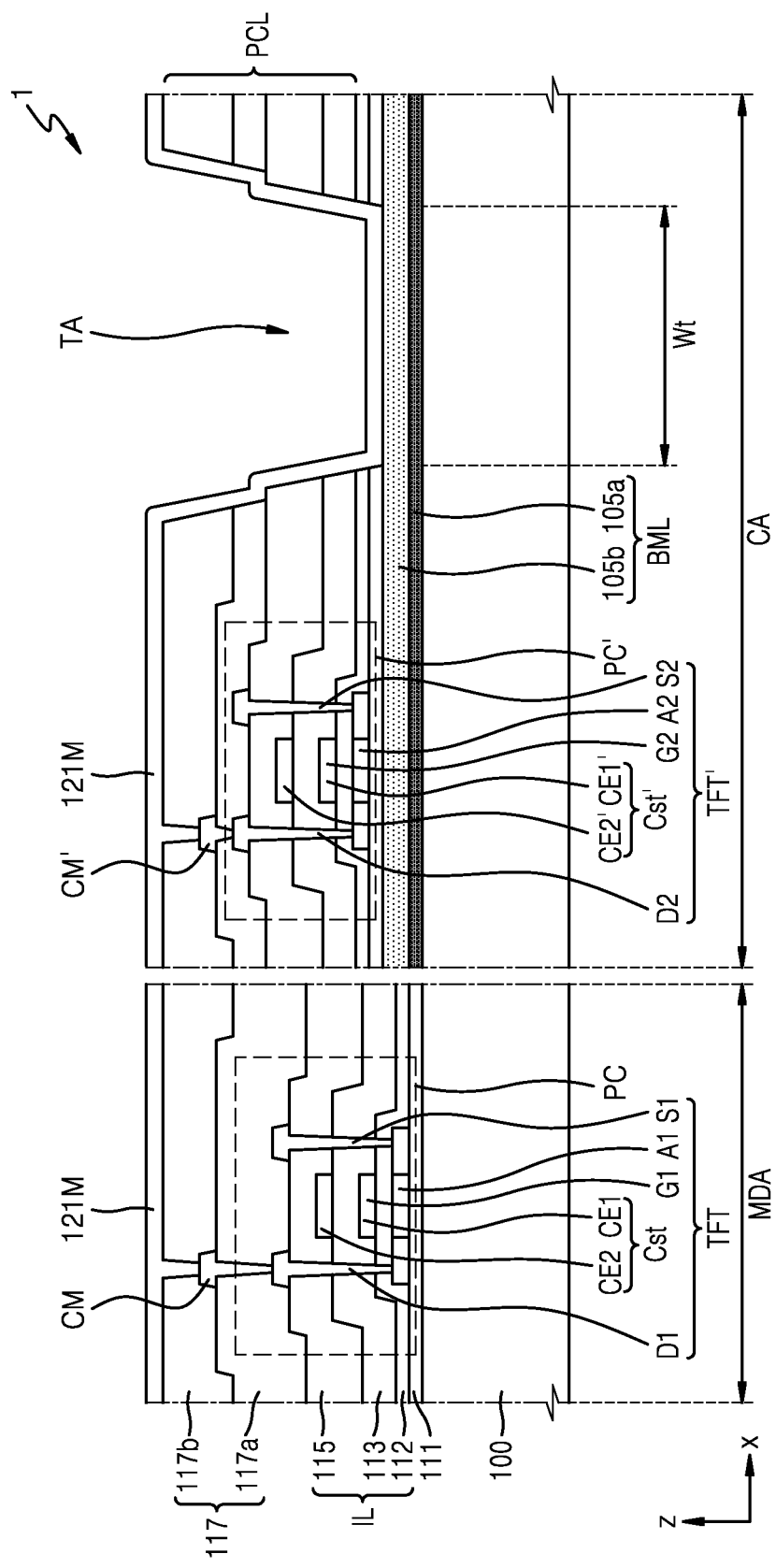

Referring to FIG. 15, after the main pixel circuit PC is formed on the upper surface of the substrate 100 in the main display area MDA and the auxiliary pixel circuit PC' is formed on the lower metal layer BML in the component area CA, the conductive material layer 121M may be formed on the upper surface of the substrate 100 in the main display area MDA and the lower metal layer BML in the component area CA.

The conductive material layer 121M may be formed on the entire surface of the substrate 100. For example, the conductive material layer 121M may be formed on the planarization layer 117 in the main display area MDA and the component area CA, and may be formed on the second metal layer 105b of the lower metal layer BML in the transmission area TA. The conductive material layer 121M may include a reflective layer, in which the reflective layer may include a conductive oxide such as, for example, ITO, IZO, ZnO, In₂O₃, IGO, and AZO, or Ag, Mg, Al, Pt, Pd, Au, Ni, Nd, Ir, or Cr, or a compound thereof.

Figure 16:
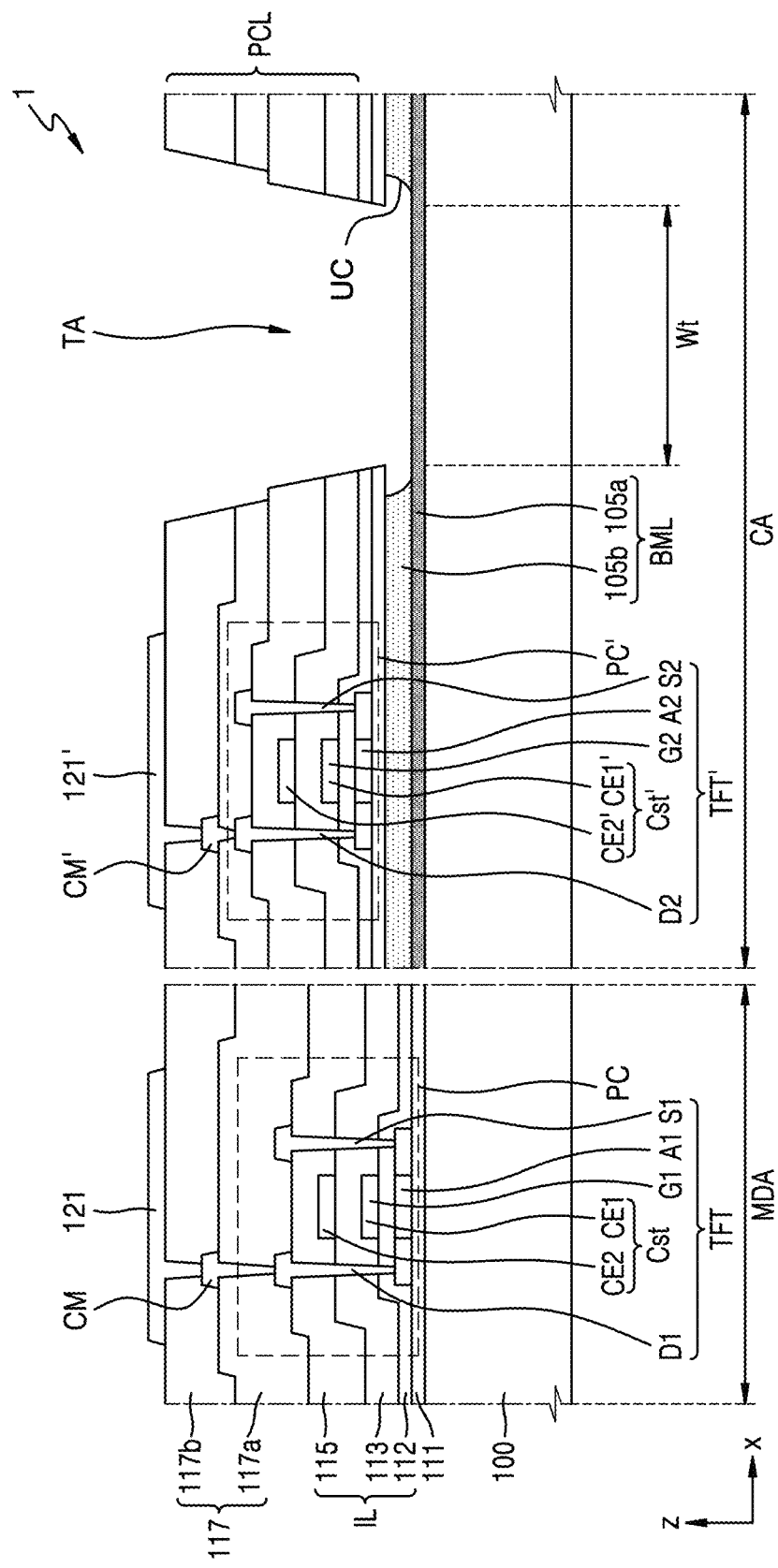

Referring to FIG. 16, after the conductive material layer 121M is formed on the upper surface of the substrate 100 in the main display area MDA and the lower metal layer BML in the component area CA, the main and auxiliary pixel electrodes 121 and 121' may be formed by removing at least a portion of the conductive material layer 121M, and the second metal layer 105b disposed in the transmission area TA may be removed.

Forming the main and auxiliary pixel electrodes 121 and 121' by removing at least the portion of the conductive material layer 121M, and removing the second metal layer 105b corresponding to the transmission area TA, may include forming the main and auxiliary pixel electrodes 121 and 121' by etching the conductive material layer 121M formed on the entire surface of the substrate 100. For example, the main pixel electrode 121 and the auxiliary pixel electrode 121' may be formed by wet-etching the conductive material layer 121M arranged in the main display area MDA and the component area CA.

When the conductive material layer 121M formed on the entire surface of the substrate 100 is etched, the second metal layer 105b formed in the transmission area TA may also be etched. The second metal layer 105b formed in the transmission area TA may be removed via the wet-etching. The undercut structure UC may be formed in the second metal layer 105b via anisotropic etching. Because the second metal layer 105b arranged in the transmission area TA is removed via wet-etching, an upper surface of the first metal layer 105a arranged below the second metal layer 105b in the transmission area TA also be exposed to the outside.

Figure 17:
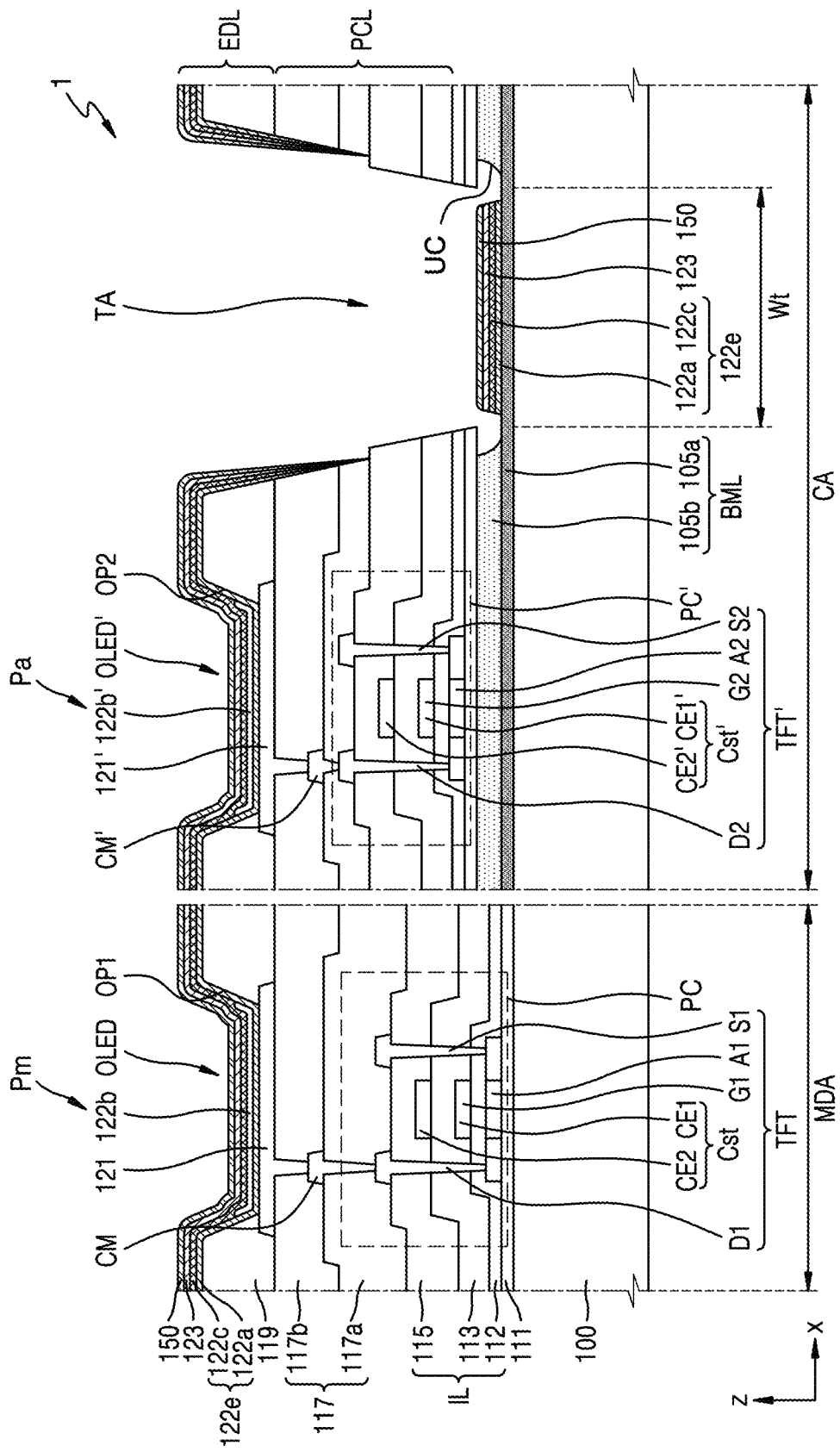

Referring to FIG. 17, after the main and auxiliary pixel electrodes 121 and 121' are formed by removing at least the portion of the conductive material layer 121M and the second metal layer 105b corresponding to the transmission area TA is removed, the organic functional layer 122e, the opposite electrode 123, and the upper layer 150 may be formed on the entire surface of the substrate to cover the main and auxiliary pixel electrodes 121 and 121' and the first metal layer 105a.

The organic functional layer 122e, the opposite electrode 123, and the upper layer 150 may integrally correspond to the main and auxiliary organic light-emitting diodes OLED and OLED' included in the main display area MDA and the component area CA. The organic functional layer 122e, the opposite electrode 123, and the upper layer 150 may be formed on an upper surface of the first metal layer 105a in the transmission area TA, the upper surface being exposed to the outside.

However, according to exemplary embodiments, materials included in the organic functional layer 122e, the opposite electrode 123, and the upper layer 150 may be thinly formed or are not formed on inner surfaces of the inorganic insulating layer IL, the planarization layer 117, and the pixel-defining layer 119 in the transmission area TA, at least portions of which are removed.

Figure 18:
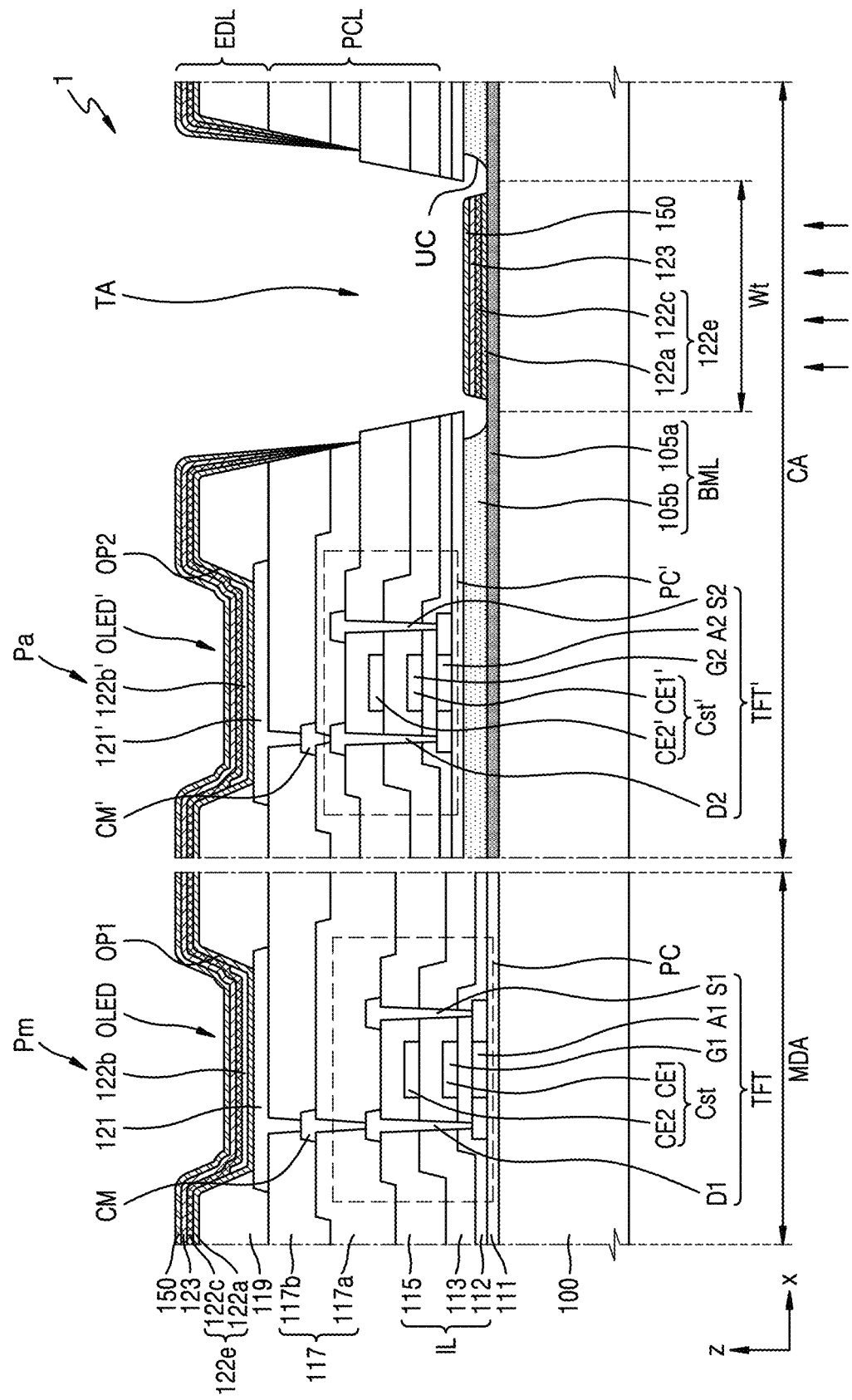

Referring to FIG. 18, after forming the organic functional layer 122e, the opposite electrode 123, and the upper layer 150 on the entire surface of the substrate 100 to cover the main and auxiliary pixel electrodes 121 and 121' and the first metal layer 105a, irradiating the lower surface that is opposite to the upper surface of the substrate 100 corresponding to the transmission area TA with the laser beam may be performed.

When the organic functional layer 122e, the opposite electrode 123, and the upper layer 150 are formed in the transmission area TA, the transmittance of the transmission area TA may be significantly reduced. Thus, to increase the transmittance of the transmission area TA, the organic functional layer 122e, the opposite electrode 123, and the upper layer 150 formed on the upper surface of the first metal layer 105a in the transmission area TA may be removed. For example, the organic functional layer 122e, the opposite electrode 123, and the upper layer 150 formed in the transmission area TA may be removed by using a laser beam.

When the organic functional layer 122e, the opposite electrode 123, and the upper layer 150 formed in the transmission area TA are removed by using the laser beam, only the opposite electrode 123 and the upper layer 150 may be removed, and the organic functional layer 122e may not be removed and may remain to deteriorate the transmittance of the transmission area TA.

Also, when a portion of the conductive material layer 121M included in the pixel electrode is allowed to remain in the transmission area TA, and the organic functional layer 122e, the opposite electrode 123, and the upper layer 150 formed in the transmission area TA are removed by using a laser beam by using the remaining conductive material layer 121M as a sacrificial layer, a portion of the conductive material layer 121M may remain and particles may be generated on a side wall portion of the transmission area TA. For example, when the conductive material layer 121M includes Ag, a melting point of Ag is low, and thus, a laser beam of a lower energy level may be used, and Ag particles may be generated.

The lower metal layer BML may be arranged in the component area CA except for the transmission area TA, which may prevent the degradation of the characteristics of the auxiliary thin-film transistor TFT' due to light emitted from a component, etc., and which may prevent the diffraction of the light emitted from or progressing toward the component, etc., through a small gap between wires connected to the auxiliary pixel circuit PC'. However, when the lower metal layer BML has a small thickness, the degradation of the characteristics of the auxiliary thin-film transistor TFT' and the diffraction of the light via the small gap between the wires connected to the auxiliary pixel circuit PC' may not be sufficiently prevented.

When the organic functional layer 122e, the opposite electrode 123, and the upper layer 150 formed in the transmission area TA are removed by using a laser lift-off operation by using a sacrificial layer, a period of time for applying the laser beam may be increased when the sacrificial layer has a great thickness.

According to exemplary embodiments of the present disclosure, the lower metal layer BML may include the first metal layer 105a and the second metal layer 105b, which include different materials from each other, in which the second metal layer 105b has a greater thickness than the first metal layer 105a. Thus, the degradation of the thin-film transistor and the diffraction of light between wires may be prevented based on the lower metal layer BML formed in the component area CA except for the transmission area TA.

Also, because the second metal layer 105b in the transmission area TA is etched together when the conductive material layer 121M is etched, only the first metal layer 105a may remain in the transmission area TA. Thus, the organic functional layer 122e, the opposite electrode 123, and the upper layer 150 formed in the transmission area TA may be removed by irradiating the lower surface of the substrate 100 with a laser beam by using the first metal layer 105a having a smaller thickness than the second metal layer 105b as a sacrificial layer.

Figure 19:
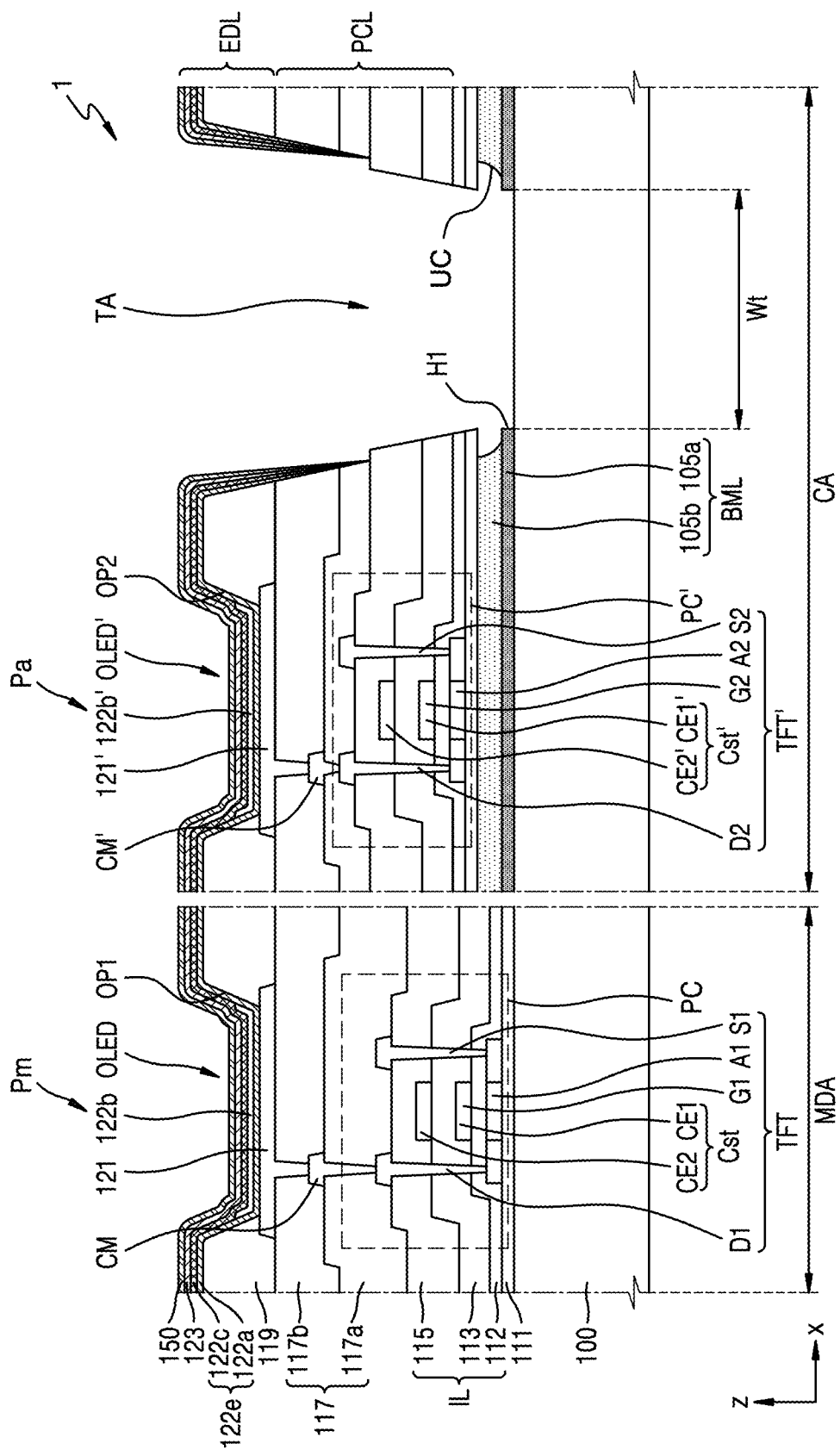

As illustrated in FIG. 19, because the first metal layer 105a formed in the transmission area TA may be removed by a laser lift-off operation, the organic functional layer 122e, the opposite electrode 123, and the upper layer 150 formed on the first metal layer 105a may be removed together. Because the organic functional layer 122e, the opposite electrode 123, and the upper layer 150 formed in the transmission area TA may be removed, the transmittance of the transmission area TA may be increased.

Because the first metal layer 105a in the transmission area TA is removed, the first hole H1 may be defined in the lower metal layer BML in the component area CA. For example, the first hole H1 may be defined in the first metal layer 105a remaining in the component area CA.

As described above, according to one or more exemplary embodiments of the present disclosure, a display apparatus having, in the display area, the component area in which various types of components are arranged, and a method of manufacturing such a display apparatus, may be realized. However, the scope of the present disclosure is not limited thereto.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display apparatus, comprising:
   a substrate comprising a main display area, a component area, and a peripheral area,
   wherein the component area comprises a transmission area, and the peripheral area is arranged outside the main display area;
   a main thin-film transistor arranged in the main display area;
   a main organic light-emitting diode arranged in the main display area and connected to the main thin-film transistor;
   an auxiliary thin-film transistor arranged in the component area;
   an auxiliary organic light-emitting diode arranged in the component area and connected to the auxiliary thin-film transistor; and
   a lower metal layer arranged between the substrate and the auxiliary thin-film transistor in the component area and having an undercut structure.

2. The display apparatus of claim 1, wherein the lower metal layer comprises a first metal layer having a first thickness in a thickness direction of the display apparatus, and a second metal layer having a second thickness in the thickness direction of the display apparatus,
   wherein the second thickness is greater than the first thickness.

3. The display apparatus of claim 2, wherein the first thickness is about 200 Å to about 400 Å, and the second thickness is about 2,500 Å to about 3,500 Å.

4. The display apparatus of claim 2, wherein the lower metal layer comprises a first hole corresponding to the transmission area.

5. The display apparatus of claim 2, wherein the second metal layer has the undercut structure.

6. The display apparatus of claim 2, wherein the first metal layer comprises at least one of Ti, Cr, ITO, IZO, ZnO, In2O3, IGO, and AZO.

7. The display apparatus of claim 2, wherein the second metal layer comprises Mo.

8. The display apparatus of claim 1, wherein the lower metal layer is directly arranged on an upper surface of the substrate.

9. The display apparatus of claim 1, wherein the lower metal layer and the auxiliary thin-film transistor at least partially overlap each other.

10. The display apparatus of claim 1, further comprising:
    an encapsulation substrate arranged above the substrate.

11. The display apparatus of claim 1, further comprising:
    a component arranged below the substrate in the component area.

12. The display apparatus of claim 11, wherein the component comprises an imaging device or a sensor.

13. A display apparatus, comprising:
    a substrate comprising a main display area, a component area, and a peripheral area,
    wherein the component area comprises a transmission area, and the peripheral area is arranged outside the main display area;
    a main thin-film transistor arranged in the main display area;
    a main organic light-emitting diode arranged in the main display area and connected to the main thin-film transistor;
    an auxiliary thin-film transistor arranged in the component area;
    an auxiliary organic light-emitting diode arranged in the component area and connected to the auxiliary thin-film transistor;
    a lower metal layer arranged between the substrate and the auxiliary thin-film transistor in the component area; and
    a metal layer arranged on the lower metal layer and having an undercut structure.

14. The display apparatus of claim 13, further comprising:
    an auxiliary storage capacitor arranged in the component area,
    wherein the auxiliary thin-film transistor comprises an auxiliary gate electrode, and the auxiliary storage capacitor comprises an auxiliary lower electrode and an auxiliary upper electrode.

15. The display apparatus of claim 14, wherein the metal layer comprises a first metal layer and a second metal layer arranged on the first metal layer and having the undercut structure.

16. The display apparatus of claim 15, wherein the metal layer is arranged on a same layer as the auxiliary gate electrode.

17. The display apparatus of claim 15, wherein the metal layer is arranged on a same layer as the auxiliary upper electrode.

* * * * *